(12) United States Patent
Iwase

(10) Patent No.: US 10,040,946 B2
(45) Date of Patent: Aug. 7, 2018

(54) FUNCTIONAL FILM MANUFACTURING METHOD AND FUNCTIONAL FILM

(71) Applicant: FUJIFILM Corporation, Tokyo (JP)

(72) Inventor: Eijiro Iwase, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 179 days.

(21) Appl. No.: 15/075,996

(22) Filed: Mar. 21, 2016

(65) Prior Publication Data

US 2016/0201190 A1 Jul. 14, 2016

Related U.S. Application Data

(60) Division of application No. 14/185,288, filed on Feb. 20, 2014, now abandoned, which is a continuation of
(Continued)

(30) Foreign Application Priority Data

Aug. 31, 2011 (JP) ................... 2011-188736

(51) Int. Cl.
*C09D 5/00* (2006.01)
*B05D 1/26* (2006.01)
(Continued)

(52) U.S. Cl.
CPC ............. *C09D 5/00* (2013.01); *B05D 1/265* (2013.01); *B05D 3/06* (2013.01); *C08J 7/06* (2013.01);
(Continued)

(58) Field of Classification Search
CPC ...................................................... C09D 5/00
See application file for complete search history.

(56) References Cited

U.S. PATENT DOCUMENTS 2,681,294 A * 6/1954 Beguin ............... B29C 47/8845
118/300
5,718,965 A 2/1998 Shiroeda et al.
(Continued)

FOREIGN PATENT DOCUMENTS

EP 2085497 A2 8/2009
EP 2199427 A2 6/2010
(Continued)

OTHER PUBLICATIONS

International Search Report issued in PCT/JP2012/070789 dated Nov. 6, 2012.
(Continued)

*Primary Examiner* — Francisco W Tschen
(74) *Attorney, Agent, or Firm* — Edwards Neils, LLC; Jean C. Edwards, Esq.

(57) ABSTRACT

A functional film manufacturing method, in manufacturing a functional film having an organic layer on a support and an inorganic layer on the organic layer, comprises steps of preparing a coating material containing an organic compound which has a glass transition temperature of 100° C. or higher and is to be the organic layer, and an organic solvent; coating a support surface with 5 cc/m² or more of the coating material such that the organic layer thickness becomes 0.05 to 3 μm; forming the organic layer by drying the coating material on the support surface such that the coating material has a viscosity of 20 cP or higher and a surface tension of 34 mN/m or less in a decreasing-rate-of-drying state, and curing the organic compound; and forming the inorganic layer on the organic layer surface by a vapor phase deposition method accompanied by generation of plasma.

19 Claims, 2 Drawing Sheets

Related U.S. Application Data application No. PCT/JP2012/070789, filed on Aug. 16, 2012.

(51) Int. Cl.

| | | |
|---|---|---|
| B05D 3/06 | (2006.01) | |
| C08J 7/06 | (2006.01) | |
| C23C 16/30 | (2006.01) | |
| C23C 16/40 | (2006.01) | |
| C23C 16/50 | (2006.01) | |
| C23C 16/02 | (2006.01) | |
| C23C 16/34 | (2006.01) | |
| C23C 16/54 | (2006.01) | |
| C09D 133/08 | (2006.01) | |
| C23C 16/56 | (2006.01) | |
| C09D 123/04 | (2006.01) | |
| B05D 7/04 | (2006.01) | |
| B05D 7/00 | (2006.01) | |

(52) U.S. Cl.
CPC ......... *C09D 123/04* (2013.01); *C09D 133/08* (2013.01); *C23C 16/0272* (2013.01); *C23C 16/308* (2013.01); *C23C 16/345* (2013.01); *C23C 16/401* (2013.01); *C23C 16/403* (2013.01); *C23C 16/50* (2013.01); *C23C 16/545* (2013.01); *C23C 16/56* (2013.01); *B05D 7/04* (2013.01); *B05D 7/54* (2013.01); *B05D 2252/02* (2013.01); *C08J 2333/14* (2013.01); *C08L 2312/08* (2013.01); *Y10T 428/24372* (2015.01)

(56) References Cited

U.S. PATENT DOCUMENTS

| | | | | |
|---|---|---|---|---|
| 2006/0232735 A1* | 10/2006 | Hokazono et al. | ..... | B32B 27/08 349/122 |
| 2007/0227034 A1* | 10/2007 | Ogawa | ........... | F26B 13/10 34/444 |
| 2008/0220198 A1 | 9/2008 | Tsukahara et al. | | |
| 2009/0061223 A1* | 3/2009 | Tsukahara | ........... | B32B 7/12 428/349 |
| 2009/0095345 A1 | 4/2009 | Murakami et al. | | |
| 2010/0261008 A1* | 10/2010 | Kikuchi | ........... | C08J 7/045 428/332 |
| 2011/0206900 A1 | 8/2011 | Iwase | | |

FOREIGN PATENT DOCUMENTS

| | | |
|---|---|---|
| JP | 2002-264274 A | 9/2002 |
| JP | 2003-013020 A | 1/2003 |
| JP | 2007-021871 A | 2/2007 |
| JP | 2007-277631 A | 10/2007 |
| JP | 2009-172986 A | 8/2009 |

OTHER PUBLICATIONS

International Preliminary Report on Patentability issued by the International Bureau dated Mar. 13, 2014 in connection with priority application PCT/JP2012/070789.

Office Action issued by the Chinese State Intellectual Property Office dated Sep. 29, 2014, in connection with Chinese Patent Application No. 201280041757.4.

Non-Final Office Action issued in U.S. Appl. No. 14/185,288 dated Mar. 30, 2015.

Final Office Action issued in U.S. Appl. No. 14/185,288 dated Oct. 22, 2015.

Office Action issued by the Korean Intellectual Property Office dated Oct. 27, 2015 in connection with Korean Patent Application No. 10-2014-7004917.

Extended European Search Report, issued by the European Patent Office dated Apr. 6, 2016 in connection with European Patent Application No. 12828475.9.

Office Action, issued by the European Patent Office dated Apr. 13, 2017, in connection with corresponding European Patent Application No. 12828475.9.

\* cited by examiner

FUNCTIONAL FILM MANUFACTURING METHOD AND FUNCTIONAL FILM

CROSS REFERENCE TO RELATED APPLICATIONS

This application is a Divisional Application of U.S. patent application Ser. No. 14/185,288, filed on Feb. 20, 2014, which is a continuation application of International Application PCT/JP2012/070789 filed on Aug. 16, 2012, which was published under PCT Article 21(2) in Japanese, which claims priority under 35 U.S.C. 119(a) to Japanese Patent Application No. 2011-188736 filed on Aug. 31, 2011, all of which are hereby expressly incorporated by reference into the present application.

BACKGROUND OF THE INVENTION

The present invention relates to a functional film such as a gas barrier film constituted with organic and inorganic layers formed on a support, and a manufacturing method of the functional film.

In various apparatuses including optical elements, display apparatuses such as liquid crystal displays and organic EL displays, various semiconductor apparatuses, and solar cells, a gas barrier film is used for sites or parts that need to exhibit moisture-proof properties. The gas barrier film is also used as a material for packing foods, electronic parts, or the like.

The gas barrier film generally has a constitution in which a plastic film such as a polyethylene terephthalate (PET) film is used as a support (substrate), and a film exhibiting gas barrier properties (hereinafter, also referred to as a "gas barrier film") is formed on the support. As films used as the gas barrier film, for example, films formed of various inorganic compounds such as silicon nitride, silicon oxide, and aluminum oxide are known.

Regarding a constitution that enables such a gas barrier film to exhibit a higher degree of gas barrier properties, a gas barrier film which has an organic layer (organic compound layer) as a base layer (undercoat layer) formed of an organic compound on a surface of a support and an inorganic layer (inorganic compound layer) formed of an inorganic compound exhibiting gas barrier properties on the organic layer, is known. Hereinafter, the gas barrier film which has the organic layer as a base layer and the inorganic layer on the organic layer is also called an organic/inorganic laminate-type gas barrier film.

For example, JP 2002-264274 A discloses a gas barrier film (transparent gas barrier laminate film) having a transparent plastic film as a support, an organic layer which is obtained by curing a UV-curable resin or an electron beam-curable resin and has a three-dimensional network structure on a surface of the support, and an inorganic layer on the organic layer.

Moreover, JP 2009-172986 A discloses a gas barrier film (barrier film substrate) having on a support an organic layer which is formed by polymerizing a mixture containing a monomer having two predetermined acrylate structures and a monomer having three or more of the same acrylate structures, and an inorganic layer on the organic layer.

As described in JP 2002-264274 A and JP 2009-172986 A, in the organic/inorganic laminate-type gas barrier film, the surface on which the inorganic film is formed is planarized through the organic layer formed on the support, whereby a high degree of gas barrier properties is obtained.

Generally, an organic layer is formed by a coating method using a coating material. Accordingly, the organic layer exhibits a high degree of self-leveling properties during the formation thereof, and can easily form a smooth surface. Consequently, when the film has such an organic layer, irregularities of a surface of the support are covered such that the surface can be smooth and planar.

When an inorganic layer exhibiting gas barrier properties is formed on such a planar organic layer, it is possible to form the inorganic layer while maintaining smoothness of the organic layer. As a result, a uniform inorganic layer that is not cracked, broken, or peeled can be formed throughout the entire surface, and accordingly, excellent gas barrier properties can be obtained.

Meanwhile, as described in JP 2007-277631 A, JP 2003-13020 A and JP 2007-21871 A, a large amount of foreign substances adhere on a surface of a plastic film which is mainly used as a support in the gas barrier film. The foreign substances are mostly residual oligomers formed during formation of the support, airborne particles that have electrically-charged and adhered, and the like. Most of the foreign substances have a size of about several micrometers.

In order to form an organic layer having a flat surface and completely covering (embedding) the foreign substances having such a size, in most cases, it is necessary to form an organic layer having a sufficient thickness for the state of the surface of the support, for instance, taking the foreign substances adhered on the support surface into account. That is, in order to obtain an organic layer having a flat surface as well as covering the foreign substances of about several micrometers, it is necessary to form an organic layer having a thickness exceeding 10 μm.

However, the thicker the organic layer is, the more easily cracks and the like occur in the organic layer. Further, when the support is a thin substance, curls and the like thereof are caused by the increased thickness of the organic layer.

Moreover, when the thickness of the organic layer is increased, the gas barrier film loses flexibility, and the original purpose for which the film is used cannot be achieved. In addition, the cracks or curls caused as above also significantly deteriorate the flexibility.

In addition, in view of productivity or costs of raw materials, the increase in the thickness of the organic layer is disadvantageous.

When the surface of the support is washed before the organic layer is formed, the above problems can be reduced to a large extent. Moreover, considering the quality of the gas barrier film to be obtained, needless to say, it is preferred for the surface of the support to be clean.

Therefore, as described in JP 2007-277631 A, JP 2003-13020 A and JP 2007-21871 A, in conventional gas barrier films, the support surface is cleaned by an adhesive roller or the like before an intended film is formed on the surface so as to remove foreign substances on the support surface, and then a film for achieving an intended function is formed on the support surface.

In particular, in the organic/inorganic laminate-type gas barrier film having a high degree of gas barrier properties with a moisture vapor transmission rate of less than $1.0 \times 10^{-3}$ [g/(m$^2$·day)] as described in JP 2009-172986 A, it is considered as important for the support surface on which an organic layer is formed to be clean such that the organic layer secures a higher degree of surface smoothness. This point is indisputable from the fact that JP 2009-172986 A discloses that it is preferred to form the organic layer (film) in a clean room.

Accordingly, in the organic/inorganic laminate-type gas barrier film, before the organic layer is formed on the support surface, the support surface is cleaned by using an adhesive roller or the like to remove foreign substances on the support surface, and then the organic layer and the like are formed to thereby form the organic layer having a flat surface.

SUMMARY OF THE INVENTION

However, in the actual mass production of the gas barrier film, there are various difficulties in obtaining a thin organic layer having excellent surface flatness by performing cleaning in the production site and forming an organic layer with the sufficiently-cleaned support surface.

As described above, a large amount of foreign substances adhere on a common plastic film that is to be used as a support of the gas barrier film.

Therefore, in production facilities required to have a high production efficiency, a high-performance cleaning apparatus (foreign substance removing apparatus) is necessary to remove a large amount of foreign substances adhering on the support surface in the in-line production to a level at which a flat organic layer can be formed. In addition, as described above, these foreign substances have a size of about several micrometers. Therefore, it is difficult to detect the foreign substances in the in-line production by using a CCD camera or the like conventionally used for monitoring a production line, and hence high-performance equipment is necessary.

Moreover, the organic layer is generally formed by a coating method implemented under atmospheric pressure. Accordingly, even during the period of time that the support is supplied to a coating apparatus and coated with a coating material, foreign substances present in the environment in which the apparatus is installed adhere onto the support. Likewise, foreign substances adhere onto the support during the storage and transportation of the support.

In order to avoid these problems, it is necessary to have means configured to clean an atmosphere of the environment in which supports are managed or organic layers are formed, for example, storing a support in a clean room and, as described in JP 2009-172986 A, forming an organic layer in a clean room.

If it is possible to use a support which is manufactured in a manufacturing facility whose environment is highly controlled, which is stored in a clean environment such as a clean room, and which thus has a surface having an extremely small amount of foreign substances thereon, the surface of this support may not need to be cleaned.

However, needless to say, such a support is very expensive, and hence the costs of raw materials greatly increase. Moreover, even in this case, the management of the environment for forming organic layers is still necessary.

That is, in the production site required to have productivity, in order to form an organic layer on a support having a surface free of foreign substances and the like to form the organic layer having a flat surface, an extremely expensive, high-performance, large-scale apparatus or expensive raw materials are necessary. Consequently, considering equipment costs, running cost of the management of the equipment, and the like, there are many difficulties.

In addition, cleaning of a substrate surface and control of the environment for forming organic layers may lead to the decrease in the production efficiency such as the decrease in the production line speed.

In an organic/inorganic laminate-type functional film such as a gas barrier film having an organic layer as a base layer on a support and an inorganic layer exhibiting gas barrier properties on the organic layer, the present invention aims to solve the problems of the conventional techniques described above and to provide a functional film which makes it possible to obtain high-performance products having a high degree of gas barrier properties and the like at low cost and with a high productivity by using a general support having a surface to which a large amount of foreign substances adhere without performing advanced cleaning of the support surface or performing cleaning of the environment for forming organic layers and without unnecessarily increasing the thickness of an organic layer, and a manufacturing method of the functional film.

In order to solve the above problems, the present invention provides a functional film manufacturing method, in manufacturing a functional film having an organic layer on a support and an inorganic layer on the organic layer, comprising the steps of:

preparing a coating material containing an organic compound which has a glass transition temperature of 100° C. or higher and is to be the organic layer, and an organic solvent;

coating a surface of the support with the coating material in an amount of 5 cc/m$^2$ or more such that a thickness of the organic layer becomes 0.05 to 3 μm;

forming the organic layer by drying the coating material coated on the surface of the support such that the coating material has a viscosity of 20 cP or higher and a surface tension of 34 mN/m or less in a decreasing-rate-of-drying state, and then curing the organic compound; and forming the inorganic layer on a surface of the formed organic layer by a vapor phase deposition method accompanied by generation of plasma.

In the functional film manufacturing method of the present invention, preferably, the coating material contains a surfactant in a concentration of, excluding the organic solvent, 0.005 to 7% by weight.

Preferably, the support is coated with the coating material by a die coating method.

Preferably, the viscosity of the coating material to be coated on the support is 0.8 to 10 cP.

Preferably, the inorganic layer is formed by the vapor phase deposition method accompanied by generation of plasma while the support on which the organic layer has been formed is transported in a predetermined direction.

Preferably, the support is drawn from a support roll obtained by rolling up the support having a long length to form a roll shape, the organic layer is formed by coating the support with the coating material, drying the coating material and curing the organic compound while the drawn support is transported in a longitudinal direction, and the support on which the organic layer has been formed is rolled up again to form a roll shape to obtain a support/organic layer roll; and the support on which the organic layer has been formed is drawn from the support/organic layer roll, the inorganic layer is formed while the support is transported in the longitudinal direction, and the support on which the inorganic layer has been formed is rolled up again to form a roll shape.

Preferably, the organic compound contained in the coating material is a (meth)acrylate-based organic compound which is crosslinked by photopolymerization reaction.

Preferably, the inorganic layer is formed of one of silicon nitride, silicon oxide, silicon oxynitride, and aluminum oxide.

The present invention further provides a functional film comprising:

a support;

an organic layer formed on the support; and an inorganic layer formed on the organic layer, wherein the support has on its surface 10 or more foreign substances per 1 cm²; and the organic layer contains an organic compound having a glass transition temperature of 100° C. or higher as a main component and has a film thickness of 0.05 to 3 μm being smaller than a size of at least one of the foreign substances on the surface of the support in a film thickness direction.

In the functional film of the present invention, preferably, the organic layer contains 0.005 to 7% by weight of a surfactant.

Preferably, the organic layer is formed by coating a coating material containing a component that is to be the organic layer.

It is preferred to comprise a protective organic layer as an uppermost layer.

It is preferred to comprise one or more combinations of a middle organic layer as a lower layer and a middle inorganic layer as an upper layer on the inorganic layer.

Preferably, the organic layer, and optionally a middle organic layer, is obtained by crosslinking a (meth)acrylate-based organic compound by polymerization reaction.

Preferably, the inorganic layer is formed of one of silicon nitride, silicon oxide, silicon oxynitride, and aluminum oxide.

According to the functional film manufacturing method of the present invention having the above configuration, it is possible to manufacture a high-performance functional film such as a gas barrier film exhibiting a high degree of gas barrier properties at low cost and with a high productivity by making advanced cleaning of the support surface and cleaning of the environment for forming organic layers unnecessary, by using an ordinary inexpensive support, and without unnecessarily increasing the thickness of an organic layer.

The functional film of the present invention that is manufactured by the functional film manufacturing method of the present invention is thin, has sufficient flexibility, exhibits high performance, and is inexpensive.

BRIEF DESCRIPTION OF THE DRAWINGS

FIG. 2A is an organic layer forming apparatus and FIG. 2B is an inorganic layer forming apparatus.

DETAILED DESCRIPTION OF THE INVENTION

Hereinafter, a functional film manufacturing method and functional film of the present invention will be described in detail based on preferred examples illustrated in the attached drawings.

Figure 1A:
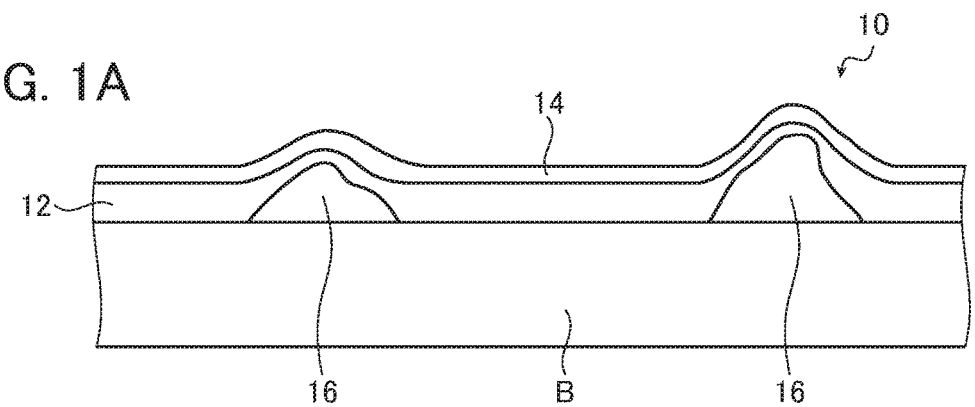
FIGS. 1A to 1C are views each conceptually showing an example of a functional film manufactured by a manufacturing method of the present invention.

FIG. 1A conceptually shows an example of a gas barrier film using a functional film of the present invention.

The gas barrier film 10 has an organic layer 12 on (a surface of) a support B, and an inorganic layer 14 on (a surface of) the organic layer 12. Basically, the gas barrier film 10 is manufactured by the functional film manufacturing method of the present invention, which will be described later.

It should be noted that the functional film of the present invention is not limited to a gas barrier film.

Specifically, the present invention can be used in various ways for known functional films such as various optical films including optical filters and light reflection preventing films. However, although the detail will be described later, according to the present invention, it is possible to form the inorganic layer 14 in which the number of voids such as ruptured portions or not-formed portions has been greatly reduced. Accordingly, the present invention is optimally used for a gas barrier film of which the performance significantly deteriorates due to voids of the inorganic layer 14.

The functional film of the present invention is not limited to the configuration shown in FIG. 1A as long as the functional film has the organic layer 12 to be described later on the support B as well as the inorganic layer 14 to be described later on the organic layer 12, and various layer configurations can be used.

Figure 1B:
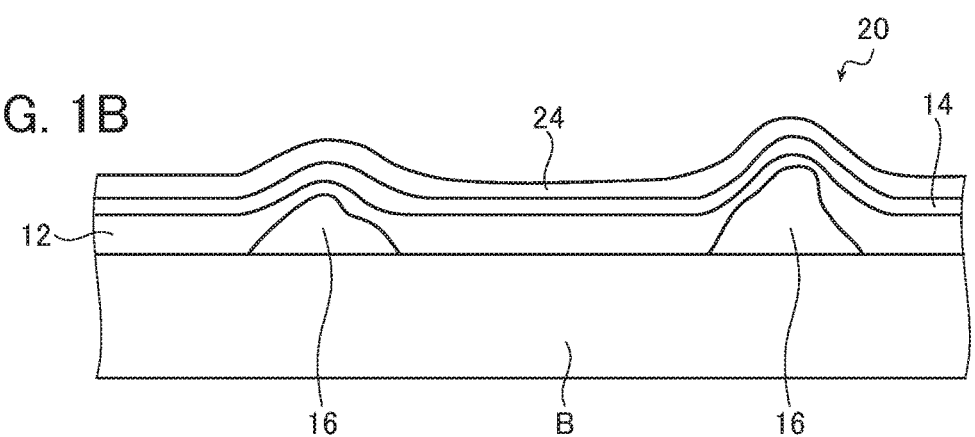

For example, as a functional film 20 shown in FIG. 1B, a configuration in which a protective organic layer 24 (uppermost layer) used mainly for protecting the inorganic layer 14 is placed on the inorganic layer 14 may be adopted.

Figure 1C:
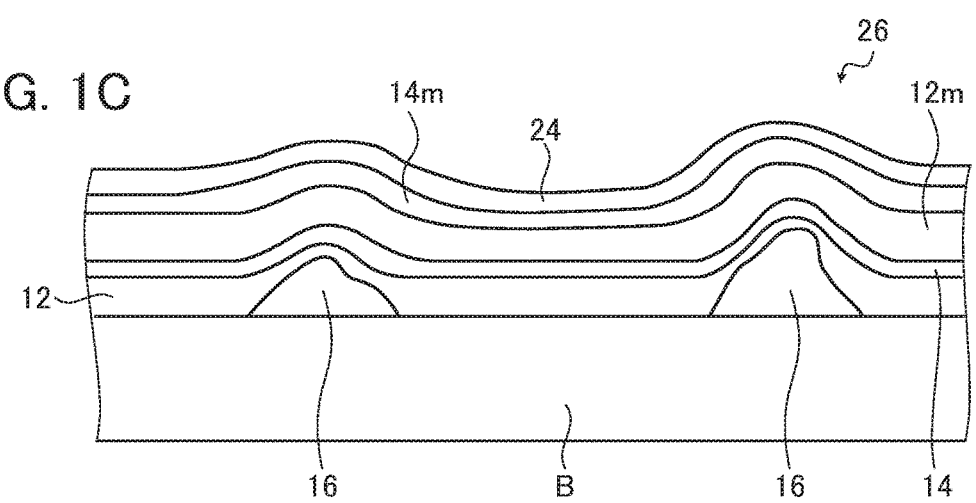

Moreover, as a configuration that can realize a higher performance, like a functional film 26 shown in FIG. 1C, one or more combinations of a middle organic layer 12m as an underlayer and a middle inorganic layer 14m as an overlayer (alternately laminated structure of an inorganic layer and an organic layer) may be provided on the inorganic layer 14. Alternatively, the functional film may further have the protective organic layer 24 as the uppermost layer.

In these functional films, both of the middle organic layer 12m and the protective organic layer 24 may be formed in the same manner as the organic layer formed for the known organic/inorganic laminate-type functional films disclosed in, for example, JP 2002-264274 A and JP 2009-172986 A stated above. The middle inorganic layer 14m may be configured to be equivalent to the inorganic layer 14 to be described later.

Further, when the functional film has a plurality of organic layers and/or inorganic layers, each of the organic and inorganic layers may be formed of the same material or different materials.

In the manufacturing method of the present invention, the support (substrate/base material) B is not particularly limited. Specifically, various known sheet-like substances used as supports of functional films such as gas barrier films can be used as the support B.

It is preferred to use a sheet-like support B (web-like support B) having a long length such that organic and inorganic layers can be formed by the Roll-to-Roll process which will be described later.

Specific preferred examples of the support B include plastic films formed of various plastics (polymer materials) such as polyethylene terephthalate (PET), polyethylene naphthalate (PEN), polyethylene, polypropylene, polystyrene, polyamide, polyvinyl chloride, polycarbonate, polyacrylonitrile, polyimide, polyacrylate, and polymethacrylate.

Moreover, the support B may have a layer (film) formed on a surface of the above plastic film for obtaining various functions, such as a protective layer, an adhesive layer, a light reflection layer, an antireflection layer, a light shielding layer, a planarizing layer, a buffer layer, and a stress relaxation layer.

Here, in the gas barrier film 10 of the present invention, a surface of the support B has 10 or more foreign substances 16 per 1 cm².

As described above, a large amount of the foreign substances 16 adhere to a general plastic film to be used as the support B. Most of those foreign substances 16 are residual oligomers formed during formation of the support, airborne particles that have been electrically-charged and adhered, and the like. Most of the foreign substances 16 have a size of about several micrometers. In order to form the organic layer 12 having a flat surface and completely covering these foreign substances, the film thickness of the organic layer 12 needs to be more than, for example, 10 μm. As described above, if the thickness of the organic layer 12 is increased, various problems such as deterioration of flexibility of the gas barrier film arise.

Accordingly, in order to obtain a high-performance film such as a gas barrier film exhibiting a high degree of gas barrier properties, it is preferred for the surface of the support B to have a small amount of the foreign substances 16.

However, as described above, in order to form the organic layer 12 on the support B free of foreign substances to thereby obtain the organic layer 12 having a flat surface in actual production facilities, a high-performance cleaning apparatus for cleaning the support surface or means configured to clean an atmosphere of the environment in which the organic layer is stored or formed, such as a clean room, is necessary. As a result, the costs of production equipment and the running cost greatly increase, and thus there are great difficulties to realize this.

If a highly-managed support B that has a small amount of foreign substances is used, cleaning may not need to be performed. However, such a support B is very expensive, and even in this case, environmental management is still necessary.

In contrast, in the gas barrier film 10 of the present invention, the surface of the support B has 10 or more foreign substances 16 per 1 cm². In Particular, the surface of the support B preferably has thereon 10 or more foreign substances 16 having a size (height) of 3 μm or greater in the film thickness direction of the organic layer 12 per 1 cm². That is, in the present invention, ordinary plastic films or the like that are generally distributed are used as the support B without being subjected to cleaning (clean-up) or the like, and the organic layer 12 is formed on the support B in a normal environment that is not subjected to clean-up or the like of the atmosphere.

Therefore, according to the present invention, a high-performance functional film such as the gas barrier film 10 exhibiting a high degree of gas barrier properties with a moisture vapor transmission rate of less than $1 \times 10^3$ [g/(m²·day)] can be manufactured at low cost with high productivity.

In other words, in the present invention, the surface of the support B has 10 or more foreign substances 16 per 1 cm², and this shows that the gas barrier film 10 (functional film) is a low-cost gas barrier film which realizes reduction in the equipment costs and raw material costs. Moreover, in the present invention, even though the gas barrier film 10 is manufactured at low cost, the high-performance gas barrier film 10 can be obtained with high productivity.

This point will be described later in detail.

The organic layer 12 is formed on the surface of the support B.

The organic layer 12 is a layer formed of an organic compound (layer (film) containing an organic compound as a main component), and is basically obtained by subjecting monomers and/or oligomers to crosslinking (polymerizing) and curing (film curing). The organic layer 12 functions as an undercoat layer serving to appropriately form the inorganic layer 14 which exhibits an intended function such as gas barrier properties.

In the present invention, the organic layer 12 is a layer formed of an organic compound having a glass transition temperature (Tg) of 100° C. or higher. Moreover, the organic layer 12 has a thickness of 0.05 to 3 μm, and the thickness is smaller than the height of at least one of the foreign substances 16 adhering to the surface of the support B.

As shown in FIG. 1, the organic layer 12 is formed so as to cover the surface of the support B including surfaces of the foreign substances 16 without leaving voids (such that the organic layer 12 covering the surface of the support B has an extremely small number of voids (not-formed portions)).

That is, in the gas barrier film 10 of the present invention, the organic layer 12 is not a layer which is formed for covering (embedding) irregularities present on the surface of the support to planarize the surface (film formation surface) on which the inorganic layer 14 is formed.

In other words, in the present invention, the organic layer 12 is a layer which is formed so as to cover the entire surface of the support B including the foreign substances 16 and has irregularities on its surface. Furthermore, the organic layer 12 is a layer not having a thickness greater than necessary as an organic layer formed in an organic/inorganic laminate-type gas barrier film (functional film).

This point will be described later in detail.

As described above, the organic layer 12 is formed of an organic compound having a Tg of 100° C. or higher (the organic layer 12 contains an organic compound having a Tg of 100° C. or higher as a main component).

In the present invention, the organic layer 12 is formed as an undercoat layer serving to appropriately form the inorganic layer 14. As described later in detail, the organic layer 12 is formed mainly for protecting the support B and the foreign substances 16 from plasma which is generated during the formation of the inorganic layer 14.

When the Tg of the organic compound forming the organic layer 12 (hereinafter, also simply referred to as "Tg of the organic layer 12") is lower than 100° C., the organic layer 12 is etched by heat of plasma during the formation of the inorganic layer 14, whereby the formation of the inorganic layer 14 is hindered. When the organic layer 12 is etched, the organic compound of the etched organic layer 12 becomes a foreign substance and adheres to the surface of the organic layer 12 or the inorganic layer 14.

Considering the above, the Tg of the organic layer 12 is preferably 120° C. or higher, and particularly preferably 150° C. or higher.

The organic layer 12 has a thickness (film thickness) of 0.05 μm to 3 μm, and the thickness is smaller than the height of at least one of the foreign substances 16 adhering to the surface of the support B.

In the present invention, the height of the foreign substances 16 is a size of the foreign substances 16 adhering to the support surface in the film thickness direction of the organic layer 12. Further, in the present invention, the thickness of the organic layer 12 is the thickness of the organic layer 12 in an area where there are no foreign substances 16.

When the thickness of the organic layer 12 is less than 0.05 μm, it is difficult to cover the foreign substances 16 with the organic layer 12, and the organic layer 12 may not sufficiently function as a protective layer of the support B and the like during the formation of the inorganic layer 14.

In contrast, when at least one of the conditions that the thickness of the organic layer 12 exceeds 3 μm and the film thickness of the organic layer 12 is greater than the height of all the foreign substances 16 is satisfied, the organic layer 12 is excessively thick, whereby the gas barrier film 10 cannot obtain sufficient flexibility. Moreover, since the organic layer 12 is too thick, problems such as cracking of the organic layer 12 and curling of the gas barrier film 10 arise.

Considering the foregoing points, the thickness of the organic layer 12 is preferably 0.1 to 2.5 μm, and particularly preferably 0.5 to 2 μm.

As described above, in the gas barrier film 10 of the present invention, the surface of the support B has 10 or more foreign substances 16 per 1 cm$^2$. In the gas barrier film 10 of the present invention, the surface of the organic layer 12 is not a flat surface covering the foreign substances 16 but a surface having irregularities due to the foreign substances 16. Accordingly, in the gas barrier film 10 of the present invention, a difference in height of the surface of the organic layer 12 per 1 cm$^2$ is preferably 300 nm or more, and particularly preferably 500 nm or more.

In the present invention, the surface of the organic layer 12 has the difference in height as described above, and similarly to the aforementioned case of the foreign substances 16 on the support surface, this shows that the gas barrier film 10 is a low-cost gas barrier film which realizes reduction in the equipment costs and raw material costs. In the present invention, cost reduction is realized as described above and in addition, a high-performance gas barrier film is manufactured with high productivity.

The difference in height of the surface of the organic layer 12 per 1 cm$^2$ means a difference in the distance from the support B between a position closest to the support B (generally a position free of the foreign substances 16) and a position farthest from the support B (generally the top of the foreign substance 16) at the surface of the organic layer 12 corresponding to an area of 1 cm$^2$ of the support surface (1 cm$^2$ of the organic layer 12 projected to the support B).

Accordingly, the difference in height of the surface of the organic layer 12 per 1 cm$^2$ being 300 nm or more means that, for example, when the surface of the organic layer 12 (gas barrier film 10) is divided into squares of 1 cm$^2$, the difference in height of the surface of the organic layer 12 (difference in distance between a position at which the distance from the support B to the surface of the organic layer is shortest and a position at which the distance of the same is longest) is 300 nm or more in all of the squares.

In the gas barrier film 10 of the present invention, materials used to form the organic layer 12 are not particularly limited, and various known organic compounds (resins and polymer compounds) can be used as long as they have a Tg of 100° C. or higher.

Specific preferred examples include thermoplastic resins such as polyester, acrylic resins, methacrylic resins, methacrylic acid-maleic acid copolymers, polystyrene, transparent fluororesins, polyimide, fluorinated polyimide, polyamide, polyamideimide, polyetherimide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester, and acryloyl compounds; and films of polysiloxane and other organosilicon compounds.

Among these, in view of excellence in Tg and strength, an organic layer 12 constituted with polymers of radical polymerizable compounds and/or cation-polymerizable compounds having ether group as functional group is preferred.

In particular, in addition to the above Tg and strength, in view of a low refractive index and excellence in optical properties, acrylic resins or methacrylic resins which contain a polymer of monomers or oligomers of acrylate and/or methacrylate as a main component are preferred as the organic layer 12.

Among the above, acrylic resins or methacrylic resins which contain, as a main component, a polymer of monomers or oligomers of acrylate and/or methacrylate having two or more functional groups, such as dipropylene glycol di(meth)acrylate (DPGDA), trimethylolpropane tri(meth)acrylate (TMPTA), and dipentaerythritol hexa(meth)acrylate (DPHA), are particularly preferred.

In the gas barrier film 10 of the present invention, it is preferred for the organic layer 12 to contain 0.005 to 7% by weight of surfactant. That is, in the manufacturing method of the present invention that will be described later, it is preferred to form the organic layer 12 by using a coating material containing a surfactant in a concentration of, excluding an organic solvent, 0.005 to 7% by weight.

This point will be described later in detail.

The inorganic layer 14 is a layer formed of an inorganic compound (layer (film) containing an inorganic compound as a main component). In the gas barrier film 10, the inorganic layer 14 is a layer which mainly exhibits intended gas barrier properties. That is, in the functional film of the present invention, the inorganic layer is a layer which mainly exhibits an intended function such as gas barrier properties, optical filtering properties like the transmission and shielding of light of a predetermined wavelength band, and the like.

As described above, according to the present invention, it is possible to appropriately form the inorganic layer 14 by covering the top of the organic layer 12 without leaving voids (by covering the top of the organic layer 12 such that an extremely small number of voids (not-formed portions) are left). Accordingly, as the inorganic layer 14, a layer formed of an inorganic compound, such as silicon nitride, that exhibits gas barrier properties and significantly deteriorates in its performance due to voids and the like, is preferred.

In the gas barrier film 10, various inorganic compounds that exhibit gas barrier properties can be used as the inorganic layer 14.

Specific preferred examples thereof include films formed of inorganic compounds including metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; oxides of silicon such as silicon oxide, silicon oxide nitride, silicon oxycarbide, and silicon nitride oxide carbide; nitrides of silicon such as silicon nitride and silicon nitride carbide; carbides of silicon such as silicon carbide; hydrides of these; mixtures of two or more of these; and the above compounds containing hydrogen.

In particular, silicon nitride, silicon oxide, silicon oxynitride, and aluminum oxide are preferably used for the gas barrier film since these compounds can exhibit excellent gas barrier properties.

It should be noted that, when the present invention is used for functional films other than a gas barrier film, an inorganic compound which exhibits an intended function such as filter properties of transmitting light of a predetermined wavelength band and shielding light of other wavelength bands and a predetermined refractive index may be appropriately selected to form the inorganic layer 14.

Moreover, the functional film of the present invention is not limited to a functional film in which the inorganic layer 14 mainly exhibits an intended function. That is, the functional film of the present invention may exhibit an intended function by a combination of the organic layer 12 and the inorganic layer 14.

In the present invention, the thickness of the inorganic layer 14 is not particularly limited. That is, the thickness of the inorganic layer 14 may be appropriately set to a thickness that can exhibit intended gas barrier properties (function) in accordance with a material for forming the layer. According to the discussion by the inventor, the thickness of the inorganic layer 14 is preferably 10 to 200 nm.

By setting the thickness of the inorganic layer 14 to 10 nm or more, an inorganic layer 14 that stably exhibits a sufficient gas barrier performance can be formed. Generally, the inorganic layer 14 is fragile, and when the inorganic layer 14 is excessively thick, the layer may be cracked, broken or peeled. Accordingly, by setting the thickness of the inorganic layer 14 to 200 nm or less, it is possible to prevent the layer from cracking.

Considering this point, the thickness of the inorganic layer 14 is preferably 15 to 100 nm and particularly preferably 20 to 75 nm.

FIG. 2 schematically show examples of a manufacturing apparatus for manufacturing the functional film of the present invention by the functional film manufacturing method of the present invention.

Figure 2A:
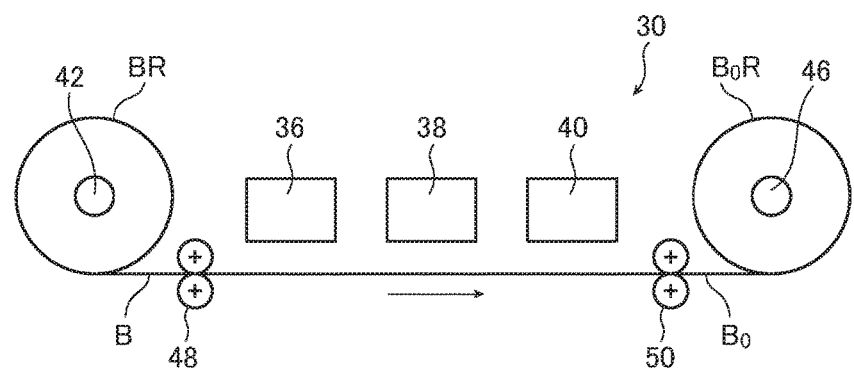
FIGS. 2A and 2B are views each conceptually showing an example of a manufacturing apparatus performing the functional film manufacturing method of the present invention.
Figure 2B:
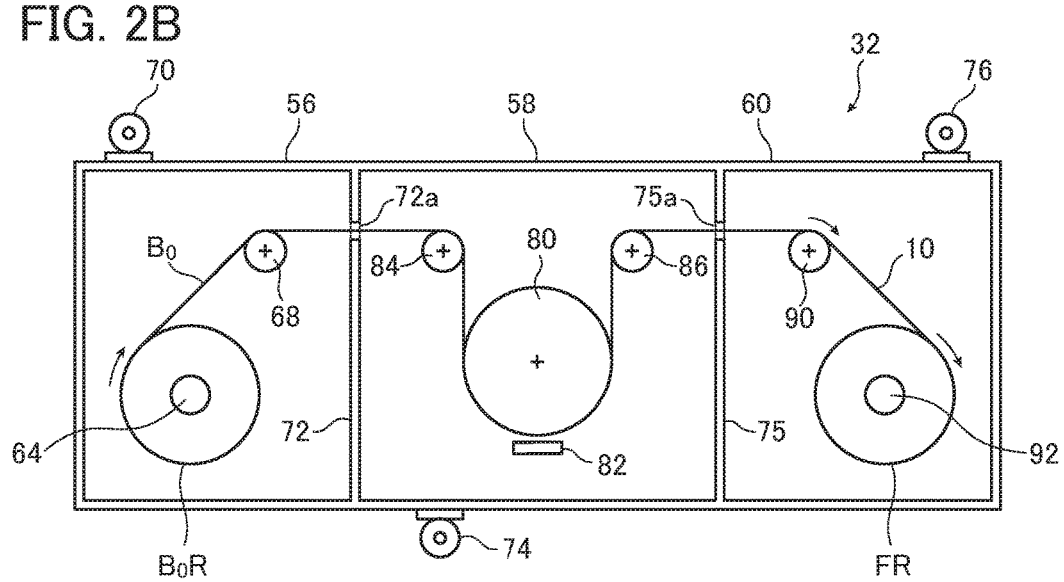

The manufacturing apparatus includes an organic film forming apparatus 30 for forming the organic layer (film) 12 and an inorganic film forming apparatus 32 for forming an inorganic layer. In FIG. 2, FIG. 2A indicates the organic film forming apparatus 30 and FIG. 2B indicates the inorganic film forming apparatus 32.

In the case of manufacturing a gas barrier film (functional film) having the layer configuration shown in FIG. 1B or 1C, the middle organic layer 12m and the protective organic layer 24 may be formed by the organic film forming apparatus 30, and the middle inorganic layer 14m may be formed by the inorganic film forming apparatus 32.

The organic film forming apparatus 30 and the inorganic film forming apparatus 32 shown in FIG. 2 are apparatuses that each form a film by so-called Roll-to-Roll (hereinafter, also referred to as "RtoR") in which a material to be formed with a film is fed from a material roll obtained by rolling up a long material to be formed with a film (a web-like material to be formed with a film) to form a roll shape, the material to be formed with a film is formed with a film while being transported in the longitudinal direction, and the film-formed material is rolled up again to form a roll shape.

In the manufacturing method of the present invention, the aforementioned RtoR is used as a preferred embodiment, whereby a functional film can be efficiently manufactured.

In an apparatus (film forming method) as the RtoR which continuously forms a film while transporting a material to be formed with a film in a predetermined direction, the film formation time is restricted due to the transportation of the material. In the present invention in which the surface of the support B having the foreign substances 16 thereon is covered with the organic layer 12 without leaving voids, it is possible to appropriately form the inorganic layer 14 within a predetermined time while inhibiting etching of the support B and the foreign substances 16, as described later. Also in this respect, in the manufacturing method of the present invention, it is preferred to use the film-forming apparatus that forms the inorganic layer 14 while transporting a substrate, and the formation of the inorganic layer 14 by use of the RtoR is particularly preferred.

The manufacturing method of the present invention is not limited to the method of manufacturing a functional film such as a gas barrier film by means of the RtoR using the long support B. As one example, the manufacturing method of the present invention may be a method of manufacturing a functional film by means of a film forming method of so-called sheet type (batch type) in which a support B in the form of cut sheet is used.

Even when the support B in the form of cut sheet is used, the method of forming the organic layer 12, the inorganic layer 14, and the protective organic layer 24 which is an organic layer being the uppermost layer is basically the same as the manufacturing method by means of the RtoR described below.

The organic film forming apparatus 30 shown in FIG. 2A is an apparatus in which the long support B (material to be formed with a film) is, while being transported in the longitudinal direction, coated with a coating material that is to be the organic layer 12, the resultant coating film is dried, and the organic compound contained in the coating film is crosslinked and cured by means of light irradiation to form the organic layer 12.

The organic film forming apparatus 30 includes, for example, coating means 36, drying means 38, light irradiation means 40, a rotary shaft 42, a roll-up shaft 46, and pairs of transportation rollers 48 and 50.

In addition to the members shown in the drawing, the organic film forming apparatus 30 may include various members such as a pair of transportation rollers, a guide member of the support B, and various sensors, which are installed in known apparatuses in which a film formation is performed by coating while transporting a long material to be formed with a film.

In the organic film forming apparatus 30, a support roll BR which is obtained by rolling up the long support B is loaded on the rotary shaft 42.

After the support roll BR is loaded on the rotary shaft 42, the support B is drawn from the support roll BR and allowed to pass through (is fed along) a predetermined transportation route from the pair of transportation rollers 48, the portions below the coating means 36, the drying means 38 and the light irradiation means 40, and the pair of transportation rollers 50, and then reach the roll-up shaft 46.

In the organic film forming apparatus 30 using the RtoR, the feeding of the support B from the support roll BR is synchronized with the rolling-up by the roll-up shaft 46 of a support Bo on which the organic layer 12 has been formed so that the long support B is, while being transported in the longitudinal direction along the predetermined transportation route, coated with a coating material that is to be the organic layer 12 by the coating means 36, dried by the drying means 38, and cured by the light irradiation means 40, whereby the organic layer 12 is formed.

The coating means 36 coats the surface of the support B with a coating material prepared in advance and used for forming the organic layer 12. The drying means 38 dries the coating material for forming the organic layer 12 that has been coated by the coating means 36.

Here, in the manufacturing method of the present invention, the coating material for forming the organic layer 12 contains an organic compound which becomes the organic layer 12 having a Tg of 100° C. or higher by being crosslinked and polymerized (organic compound which forms the organic layer 12) and an organic solvent. The coating means 36 coats such a coating material in an amount of 5 cc/m² or more to form the organic layer 12 of which the thickness becomes 0.05 to 3 μm after curing (crosslinking) as described above. In the gas barrier film 10, the film thickness of the organic layer 12 is 0.05 to 3 μm as described above and thinner than the height of at least one of the foreign substances present on the surface of the support B. In the organic layer 12, the difference in height of the surface per 1 cm² is preferably 300 nm or more.

The drying means 38 dries the coating material for forming the organic layer 12 coated by the coating means 36 such that the viscosity of the coating material becomes 20 cP or higher and the surface tension becomes 34 mN/m or less in a decreasing-rate-of-drying state.

In the present invention employing the above configuration, a general plastic film or the like is used as the support B, and cleaning of the support surface (removal of foreign substances) or the like is not necessary. Further, the storage of the support B and the formation of the organic layer 12 are carried out in an ordinary environment that does not require clean-up of the atmosphere. Moreover, the high-performance gas barrier film 10 (functional film) which has sufficient flexibility, is not curled, has no cracking at the organic layer 12, and exhibits a high degree of gas barrier properties (high functionality), can be obtained at low cost with high productivity.

As described in JP 2002-264274 A or JP 2009-172986 A, the organic/inorganic laminate-type gas barrier film (functional film) obtained by using a plastic film or the like as a support, forming an organic layer on a surface of the support and forming an inorganic layer on the organic layer has been conventionally known. In this organic/inorganic laminate-type gas barrier film, the organic layer formed on the support surface is provided to planarize the surface on which the inorganic layer is formed by covering irregularities of the support as well as foreign substances, a lubricant and the like adhering on the support surface.

That is, in the conventional organic/inorganic laminate-type gas barrier film, a flat surface of the organic layer is a surface on which the inorganic layer is formed (a film formation surface). It is considered that, because of this configuration, cracking, breaking, are peeling of the inorganic layer caused by irregularities and the like of the surface on which the inorganic layer is formed are prevented, and a uniform inorganic layer is formed on the entire surface of the organic layer, whereby excellent gas barrier properties are obtained.

As described above, however, a large amount of foreign substances (at least 10 or more per 1 cm²) having a size greater than several micrometers generally adhere on the surface of the plastic film which is mainly used as the support B. Moreover, even in an environment in which the support B is stored, or in an environment in which the organic layer 12 is formed, foreign substances adhere.

Therefore, in order to planarize the surface of the organic layer in this state, it is necessary to form a thick organic layer 12 that can cover the irregularities of the support surface including the foreign substances larger than several micrometers that adhere on the support surface.

However, when such a thick organic layer 12 is formed, problems such as cracking of the organic layer, curling of the gas barrier film, and decrease in flexibility of the gas barrier film arise. In addition, the organic layer is fabricated through crosslinking and curing by irradiation of UV rays or electron beams, but a thick organic layer cannot be sufficiently irradiated with light or electron beams in the curing and hence, the crosslink density thereof decreases. Consequently, etching resistance of the organic layer becomes insufficient, whereby, similarly to the above, the problem that an appropriate inorganic layer cannot be formed and other problems arise. Also, from the viewpoint of the quality or the like of the gas barrier film, it is preferred for the amount of foreign substances adhering on the surface of the support B to be small.

Accordingly, in the conventional laminate-type gas barrier film, as described in JP 2007-277631 A, JP 2003-13020 A and JP 2007-21871 A, the support surface is cleaned using an adhesive tape or the like to remove foreign substances on the support surface before the organic layer is formed, and then the organic layer is formed.

In particular, in the organic/inorganic laminate-type gas barrier film exhibiting a high degree of gas barrier properties with a moisture vapor transmission rate of less than $1.0 \times 10^3$ [g/(m²·day)] as described in JP 2009-172986 A, in order to secure a higher degree of surface smoothness of the organic layer, it is considered as important for the support surface on which the organic layer is formed to be clean.

However, as described above, in production facilities required to have high production efficiency, in order to remove the large amount of foreign substances 16 adhering on the support surface to a level at which the flat organic layer 12 can be formed in an in-line manner, a high-performance and expensive cleaning apparatus (apparatus for removing foreign substances) is necessary. In addition, the productivity may deteriorate due to the cleaning.

Since the organic layer 12 is generally formed by a coating method to be carried out under atmospheric pressure, even in the apparatus for forming the organic layer 12, foreign substances 16 adhere onto the surface of the support B. Likewise, foreign substances 16 adhere during the storage or transportation of the support B. In order to solve these problems, it is necessary to use means such as a clean room for cleaning the atmosphere of various types of environment including the environment in which the support B is managed or transported, the environment in which the apparatus for forming the organic layer 12 is placed, and the like. Consequently, the equipment costs and running cost increase.

If a plastic film or the like of which the surface has been cleaned to a high degree is used as the support B, cleaning may not need to be performed. However, needless to say, such a plastic film or the like is expensive, and costs of the raw material greatly increases. Moreover, even if such a support B is used, means configured to clean the atmosphere of the environment of the apparatus for forming the organic layer 12 and the like is still necessary.

As described so far, in actual production facilities strongly required to have productivity and to reduce costs, considering the costs and the like, there are many difficulties in obtaining an organic layer 12 having a flat surface by forming the organic layer 12 on a support B of which a surface has an extremely small amount of foreign substances 16. In particular, in the production equipment having higher productivity such as the organic film forming apparatus 30 using the RtoR in the illustrated example, it is more difficult to form an organic layer 12 having a flat surface with the use of a support B having an extremely small amount of the foreign substances 16.

Specifically, in order to manufacture a high-performance gas barrier film with production equipment performing mass production, a high degree of gas barrier properties need to be realized on the premise that a general plastic film is used as the support B, cleaning of the support surface is not carried out, and the organic layer 12 is formed in a normal environment in which cleaning of the atmosphere of the environment is not carried out in consideration of the production costs such as equipment costs, raw material costs and running cost, productivity, and the like.

According to the discussion by the inventor, irregularities of a surface to be formed with a film are extremely larger than the inorganic compound applied on the surface to be formed with a film to form the inorganic layer 14. That is, for the inorganic compound to be applied to form a film, only the portion where the inorganic compound is applied corresponding to the size of the inorganic compound needs to be flat to form a uniform film. Consequently, the irregularities of the surface to be formed with a film are so large that the irregularities are not a problem for the inorganic compound to be applied.

Therefore, even when the surface of the organic layer 12 has irregularities, there is no difference for the inorganic compound to be applied as compared to the case of the film formation to form the inorganic layer 14. Accordingly, it is not necessary to cover all of the irregularities of the surface of the support B to planarize the surface of the organic layer 12.

Specifically, according to the discussion by the inventor, when obtaining excellent gas barrier properties in the organic/inorganic laminate-type gas barrier film, the planarization of the surface of the organic layer 12, that is, the surface on which the inorganic layer 14 is to be formed, is not indispensable. The most important thing is to form the inorganic layer 14 free from voids such as not-formed portions and cracks.

Moreover, according to the discussion by the inventor, voids are formed in the inorganic layer 14 through the mechanisms in which the portion of the support surface that is not covered with the organic layer 12 is lost by being etched by plasma generated during the formation of the inorganic layer 14, and in which the inorganic compound to be the inorganic layer 14 cannot be appropriately applied to form a film on a surface to be formed with a film during the etching and this portion where no film is formed becomes a void (pore) of the inorganic layer 14.

In particular, foreign substances adhering on the surface of the support B mainly consist of residual oligomers formed during formation of the support, airborne particles that have been electrically-charged and adhered, and the like, and have low heat resistance. Accordingly, when surfaces of the foreign substances 16 are exposed without being covered with the organic layer 12, the foreign substances 16 are etched and due to the etching, the inorganic layer 14 is not formed in the corresponding portion so that voids are formed.

Moreover, when the Tg of the organic layer is low, the organic layer is etched by the plasma generated during the formation of the inorganic layer, similarly to the case of a highly-soft organic layer or the foreign substances 16. Therefore, similarly, the inorganic layer is not appropriately formed, and a large number of voids are formed in the inorganic layer.

Specifically, the inventor found that in order to obtain excellent gas barrier properties in the organic/inorganic laminate-type gas barrier film 10, it is important to cover the entire surface of the support B including the foreign substances 16 with the organic layer 12 having a Tg of 100° C. or higher without any space, and the organic layer 12 may be thin. In other words, the inventor found that even though the surface of the organic layer 12 has irregularities caused by the foreign substances 16, if the entire surface of the support B including the foreign substances 16 can be covered with the organic layer 12 having a high Tg without any space, the inorganic layer 14 can be formed on the surface of the organic layer 12 without leaving voids, and excellent gas barrier properties can be obtained.

The inventor also found that in the organic/inorganic laminate-type gas barrier film, when a general plastic film is used as the support B, cleaning of the surface of the support B is not performed, and cleaning of the atmosphere of the environment of the apparatus for forming the organic layer 12 is not performed at the time of forming the organic layer 12, in order to cover the surface of the support B with the organic layer 12 without leaving voids (in order to greatly reduce the number of voids (not-formed portions) of the organic layer 12 on the support surface including the foreign substances 16), the Tg of the organic layer 12, the amount of the coating material to be coated for forming the organic layer 12, and the viscosity and surface tension of the coating film having been formed by coating as measured in the decreasing-rate-of-drying state are important. That is, the inventor found that when the organic layer 12 is formed on the support B obtained by treating a general plastic film in a usual manner and having a surface on which 10 or more of the foreign substances 16 are present per 1 cm$^2$, in order to cover the surface of the support B with the organic layer 12 without leaving voids, the Tg of the organic layer 12, the amount of the coating material to be coated for forming the organic layer 12, and the viscosity and surface tension of the coating film having been formed by coating as measured in the decreasing-rate-of-drying state are important.

The present invention has been made by obtaining the above knowledge, and as described above, a coating material containing an organic solvent and an organic compound which has a Tg of 100° C. or higher and becomes the organic layer 12 is used, the surface of the support B is coated with the coating material in an amount of 5 cc/m$^2$ or more such that the thickness of the organic layer 12 becomes 0.05 to 3 µm, the coating material is dried such that, in the decreasing-rate-of-drying state, the viscosity becomes 20 cP or higher and the surface tension becomes 34 mN/m or less, and then the organic compound is cured (crosslinked/polymerized) to form the organic layer 12.

By employing the above configuration, the present invention makes it possible to obtain a high-performance gas barrier film by using a general plastic film or the like as the support B, without performing cleaning of the support B, and by forming the organic layer 12 by a coating method in the ordinary storage environment or in the ordinary environment for forming the organic layer 12 to cover the entire surface of the support B including the foreign substances 16 with the organic layer 12 which is not unnecessarily thick without leaving voids.

Moreover, since the organic layer is formed by a coating method, high productivity can be obtained. Besides, deterioration of productivity resulting from cleaning or the like does not occur.

As described above, the organic layer 12 is formed using a coating material.

The coating material forming the organic layer 12 contains an organic compound (monomer/oligomer) which is formed into the organic layer 12 having a Tg of 100° C. or higher by being crosslinked and polymerized, and an organic solvent.

As the organic compound which is formed into the organic layer 12 having a Tg of 100° C. or higher by being crosslinked and polymerized, various known organic compounds capable of forming the organic layer 12 as above (organic compound having a Tg of 100° C. or higher) can be used.

Among such compounds, as mentioned in the description for the materials for forming the organic layer 12, the radical-polymerizable compounds and/or cation-polymerizable compounds having ether group as functional group are preferred. Among these, monomers or oligomers of acrylate and/or methacrylate are particularly preferred. In particular, preferred examples thereof include monomers or oligomers of acrylate and/or methacrylate having two or more functional groups.

The Tg of the organic layer 12 is as described above.

Various additives such as a surfactant, a silane coupling agent, a photopolymerization initiator, an antistatic agent, and a filler that are used for forming known layers formed of an organic compound may be appropriately added to the coating material forming the organic layer 12, if necessary.

Here, in the present invention, the organic layer 12 contains an organic compound having a Tg of 100° C. or higher as a main component, and the content of the organic compound is preferably 50% by weight or more. The content of the organic compound in the organic layer 12 is more preferably 60% by weight or more, and particularly preferably 90% by weight or more. Furthermore, as shown in Examples to be described later, plural kinds of organic compounds forming the organic layer 12 may be mixed.

Here, it is preferred for the coating material forming the organic layer 12 to contain a surfactant in a concentration of, excluding the organic solvent, 0.005 to 7% by weight. The concentration excluding the organic solvent refers to a concentration obtained when a total of components excluding the organic solvent is regarded as 100% by weight.

Containing a surfactant in an amount of 0.005% by weight or more is preferred in terms of the fact that, for instance, the surface tension of the coating material in the decreasing-rate-of-drying state can be more appropriately controlled such that the support surface can be more reliably covered with the organic layer 12 without leaving voids.

Moreover, the content of the surfactant being 7% by weight or less is preferred in terms of the fact that, for instance, the proportion of a main monomer capable of appropriately suppressing phase separation of the coating material can be reduced, whereby the possibility that the etching resistance is affected can be reduced.

Considering the above points, the content of the surfactant in the coating material is preferably 0.05 to 3% by weight.

The coating material forming the organic layer 12 may be prepared by known methods by dissolving (dispersing) in an organic solvent the organic compound which becomes the organic layer 12 and optionally-added various additives and the like such as a surfactant to be added as necessary.

The organic solvent used for preparing the coating material is not particularly limited, and it is possible to use various organic solvents such as methyl ethyl ketone (MEK), cyclohexanone, isopropyl alcohol, and acetone that are used for forming an organic layer in the organic/inorganic laminate-type functional film. As described later, the coating material is prepared by adjusting a solid content concentration and the like such that the organic layer 12 having an intended thickness is obtained by coating the coating material in an amount of 5 cc/m$^2$ or more.

In order to cover the surface of the support B including the surfaces of the foreign substances 16 with the organic layer 12 without leaving voids, the support B needs to be coated with the coating material such that a not-coated portion is not formed. That is, the surface (film-formed area) of the support B needs to be soaked in the coating material without any space. When the solid content concentration of a coating solution is too high, the viscosity is increased such that a stripe failure occurs and hence, lack of the organic layer is easily caused.

Considering this point, the viscosity of the coating material to be coated on the support B is preferably 0.8 to 10 cP, and particularly preferably 1 to 7 cP. Therefore, it is preferred to adjust the solid content concentration and the like of the coating material such that the viscosity falls within the above range.

As described above, in the organic film forming apparatus 30, while the long support B is transported in the longitudinal direction, the surface of the support B is coated with the coating material by the coating means 36, the coating material is dried by the drying means 38, and the resultant is cured by the light irradiation means 40, whereby the organic layer 12 is formed.

The coating means 36 performs coating of the coating material in an amount of 5 cc/m$^2$ or more such that the thickness of the cured organic layer 12 becomes 0.05 to 3 µm. The film thickness of the organic layer 12 is smaller than the height of at least one of the foreign substances.

When the amount of the coating material used for coating is less than 5 cc/m$^2$, in the case where, for example, coating of the coating material is performed by a die coating method, a lip clearance becomes 50 µm or less. Consequently, a problem that the process to cover the foreign substances with liquid is difficult arises, and accordingly, the entire surface of the support B including the foreign substances 16 cannot be covered with the coating film. The lip clearance herein refers to a clearance (gap) between a die and the support B in a die coater.

Considering this point, the amount of the coating material used for coating is preferably 7 cc/m$^2$ or more.

The thickness of the organic layer 12 to be formed, that is, the thickness of the cured organic layer 12 is as described above.

In the coating means 36, the method for coating the support B with the coating material is not particularly limited.

Accordingly, for coating of the coating material, any of known coating methods including a die coating method, a dip coating method, an air knife coating method, a curtain coating method, a roller coating method, a wire bar coating method, a gravure coating method, and a slide coating method can be used.

Among the above methods, a die coating method is preferably used for the reasons that the support B is not damaged since coating of the coating material can be performed in a non-contact manner, the foreign substances 16 are embedded excellently, and the like. The die coating method is excellent in embedding the foreign substances 16 since this method forms a bead (liquid pool) such that the liquid having an area equal to or larger than the size of the foreign substances can be put on the support.

As described above, the support B is then transported to the drying means 38, and the coating material coated by the coating means 36 is dried.

As described above, for forming the organic layer 12 that covers the surface of the support B including the surfaces of the foreign substances 16 without any space, the viscosity and surface tension of the coating material in the decreasing-rate-of-drying state are important. The drying means 38 dries the coating material that is to be the organic layer 12 such that the viscosity becomes 20 cP or higher and the surface tension becomes 34 mN/m or less in the decreasing-rate-of-drying state.

If the viscosity of the coating material in the decreasing-rate-of-drying state is less than 20 cP, problems arise in which, for example, voids (portions where the organic layer 12 is not formed on the support surface) are formed in the organic layer 12 due to, for instance, protrusion of the foreign substances 16 which is caused by movement of the coating material before being dried. In particular, the thickness of the coating film that is to be the organic layer 12 at the positions on the foreign substances 16 is smaller than that of a normal portion free of the foreign substances 16 by the height of the foreign substances. Accordingly, the coating material moves more easily on the foreign substances 16, and if the viscosity in the decreasing-rate-of-drying state is less than 20 cP, voids are easily formed in the organic layer 12.

Considering the above point, the viscosity of the coating material in the decreasing-rate-of-drying state is preferably 50 cP or higher, and particularly preferably 100 cP or higher.

The upper limit of the viscosity of the coating material in the decreasing-rate-of-drying state is not particularly limited, as long as the viscosity can secure coating properties when the coating material is diluted with a solvent. Considering the coating properties, the viscosity of the coating material in the decreasing-rate-of-drying state is preferably 10,000 cP or less.

If the surface tension of the coating material in the decreasing-rate-of-drying state exceeds 34 mN/m, due to a difference in the surface tension between the coating material and the support B, similarly to the above, problems arise in which, for example, the coating material moves before being dried, whereby voids are formed in the organic layer 12 due to protrusion of the foreign substances 16 or the like. In this regard, also similarly to the above, the thickness of the coating film that is to be the organic layer 12 at the positions on the foreign substances 16 is smaller than that of a normal portion free of the foreign substances 16 by the height of the foreign substances. Accordingly, the coating material moves more easily on the foreign substances 16, and if the surface tension in the decreasing-rate-of-drying state exceeds 34 mN/m, voids are easily formed in the organic layer 12.

Considering the above point, the surface tension of the coating material in the decreasing-rate-of-drying state is preferably 30 mN/m or less, and particularly preferably 28 mN/m or less.

The surface tension of the coating material in the decreasing-rate-of-drying state is not particularly limited similarly to the viscosity, as long as the surface tension can secure coating properties when the coating material is used for coating. Considering the coating properties, the surface tension in the decreasing-rate-of-drying state is preferably 23 mN/m or higher.

The method of drying the coating material is not particularly limited, and any of known drying means such as drying by heating using a heater and drying by heating using hot air can be used, as long as it can dry the coating material (remove the organic solvent) and put the coating material in the state in which crosslinking is possible before the support B reaches the light irradiation means 40, based on the transporting speed or the like of the support B.

Here, the viscosity and surface tension of the coating film in the decreasing-rate-of-drying state vary not only with the composition of the coating material but also with the drying conditions such as a drying temperature. Therefore, the drying means 38 adjusts (sets) the drying conditions such as a drying temperature according to the composition of the coating material, the transporting speed of the support B, the amount of the coating material used for coating, and the like, such that the viscosity and surface tension of the coating material (coating film) in the decreasing-rate-of-drying state satisfy the above conditions.

The support B is then transported to the light irradiation means 40. The light irradiation means 40 irradiates the coating material, which has been coated by the coating means 36 and dried by the drying means 38, with UV (UV rays), visible light, or the like to crosslink (polymerize) and cure the organic compound (monomers or oligomers of the organic compound) contained in the coating material, thereby forming the organic layer 12.

When the coating film is cured by the light irradiation means 40, the area of the support B to be irradiated with light by the light irradiation means 40 may be placed in an inert gas atmosphere (oxygen-free atmosphere) obtained by nitrogen substitution or the like. Moreover, the temperature of the support B, that is, the temperature of the coating film may be optionally adjusted during the curing by using a backup roller or the like contacting the back surface of the support.

In the present invention, the crosslinking of the organic compound is not limited to photopolymerization, and various methods such as heating polymerization, electron beam polymerization, and plasma polymerization can be used according to the type of the organic compound that is to be the organic layer 12.

In the present invention, as described above, acryl-based resins such as acrylic resins or methacrylic resins are preferably used as the organic layer 12, so that photopolymerization is preferably used.

The support B on which the organic layer 12 has been formed in the above-mentioned manner (hereinafter, the support B on which the organic layer 12 has been formed is referred to as a "support Bo") is transported while being sandwiched between the pair of transportation rollers 50 to reach the roll-up shaft 46, is rolled up again by the roll-up shaft 46 to form a roll shape, and becomes a support roll BoR which is established by rolling up the support Bo.

The support roll BoR is supplied to the inorganic film forming apparatus 32 (a supply chamber 56 thereof) shown in FIG. 2B.

The inorganic film forming apparatus 32 forms the inorganic layer (film) 14 on the surface of the organic layer 12 by a vapor phase deposition method accompanied by generation of plasma, and includes the supply chamber 56, a film formation chamber 58, and a roll-up chamber 60.

In addition to the illustrated members, the inorganic film forming apparatus 32 may further include various members such as a pair of transportation rollers, a guide member which controls the position of the support Bo in the width direction, and various sensors that are installed in known apparatuses for forming a film by a vapor phase deposition method while transporting a long material to be formed with a film.

The supply chamber 56 includes a rotary shaft 64, a guide roller 68, and vacuum exhaust means 70.

In the inorganic film forming apparatus 32, the support roll BoR obtained by rolling up the support Bo is loaded on the rotary shaft 64 of the supply chamber 56.

After the support roll BoR is loaded on the rotary shaft 64, the support Bo is allowed to pass through (is fed along) a predetermined transportation route which starts from the supply chamber 56, passes through the film formation chamber 58, and reaches the roll-up shaft 92 in the roll-up chamber 60. Also in the inorganic film forming apparatus 32 using the RtoR, the feeding of the support Bo from the support roll BoR is synchronized with the rolling-up by the roll-up shaft 92 of the support Bo (that is, the gas barrier film 10) on which the inorganic layer has been formed so that, while the support Bo is transported in the longitudinal direction, the inorganic layer 14 is continuously formed on the support Bo in the film formation chamber 58.

In the supply chamber 56, the rotary shaft 64 is rotated clockwise in the drawing by a drive source not shown in the drawing, whereby the support Bo is fed from the support roll BoR. In the supply chamber 56, the support Bo fed from the support roll BoR is guided to follow the predetermined route by the guide roller 68 and transported to the film formation chamber 58 through a slit 72a formed in a partition 72.

In the inorganic film forming apparatus 32 in the illustrated example, as a preferred mode, vacuum exhaust means 70 is disposed in the supply chamber 56 and vacuum exhaust means 76 is disposed in the roll-up chamber 60. In the inorganic film forming apparatus 32, during the film formation, these vacuum exhaust means maintain the pressures in the supply chamber 56 and the roll-up chamber 60 at a predetermined pressure in accordance with the pressure (film formation pressure) in the film formation chamber 58 that will be described later. Accordingly, the pressure in the film formation chamber 58 (film formation performed in the film formation chamber 58) is prevented from being affected by the pressures in the adjacent chambers.

The vacuum exhaust means 70 is not particularly limited, and it is possible to use various known (vacuum) exhaust means such as vacuum pumps including a turbo pump, a mechanical booster pump, a dry pump, and a rotary pump that are used in film forming apparatuses under vacuum. The same applies to other vacuum exhaust means 74 and 76 which will be described later.

The film formation chamber 58 forms the inorganic layer (film) 14 on the surface of the support Bo (that is, the surface of the organic layer 12) by a vacuum film formation method. In the illustrated example, the film formation chamber 58 includes a drum 80, film formation means 82, a guide roller 84, a guide roller 86, and the aforesaid vacuum exhaust means 74.

The support Bo having been transported to the film formation chamber 58 is guided to follow the predetermined route by the guide roller 84 and wound around the drum 80 to be placed at a predetermined position. The support Bo is transported in the longitudinal direction while being held at the predetermined position by the drum 80, and the inorganic layer 14 is formed on the support Bo by the film formation means 82 by a vapor phase deposition method accompanied by generation of plasma.

The vacuum exhaust means 74 evacuates the air of the inside of the film formation chamber 58 and establishes the degree of vacuum appropriate for forming the inorganic layer 14 by a vapor phase deposition method.

The drum 80 is a cylindrical member that rotates counterclockwise about the axis in the drawing.

The support Bo which has been supplied from the supply chamber 56, guided to follow the predetermined route by the guide roller 84, and then wound around the drum 80 to be placed at the predetermined position, is hung on a predetermined area on the circumferential surface of the drum 80. The support Bo is then transported along the predetermined transportation route while being supported and guided by the drum 80, and the inorganic layer 14 is formed on the surface of the support Bo by the film formation means 82.

The film formation means 82 forms the inorganic layer 14 on the surface of the support Bo (organic layer 12) by a vacuum film formation method.

In the manufacturing method of the present invention, as the method for forming the inorganic layer 14, various known methods such as plasma CVD and sputtering can be used, as long as they are vapor phase deposition methods (vacuum film formation methods) accompanied by generation of plasma.

Accordingly, the film formation means 82 is constituted with various members appropriate for the vapor phase deposition method to be implemented.

For example, in the case where the film formation chamber 58 forms the inorganic layer 14 by an inductively coupled plasma CVD (ICP-CVD) method, the film formation means 82 is constituted with an induction coil for forming an induction magnetic field, gas supply means configured to supply gas to the film formation area, and the like.

In the case where the film formation chamber 58 forms the inorganic layer 14 by a capacitively coupled plasma CVD (CCP-CVD) method, the film formation means 82 is constituted with a shower electrode which acts as a high-frequency electrode and a gas supply means, which is hollow and has a large number of small holes on its surface facing the drum 80 and which is connected to a reactant gas supply source; means configured to supply gas to the shower electrode; a high-frequency power source; a bias supply; and the like.

Moreover, in the case where the film formation chamber 58 forms the inorganic layer 14 by sputtering, the film formation means 82 is constituted with means configured to hold a target, a high-frequency electrode, means configured to supply gas, and the like.

Regardless of the film formation method used, in the present invention, the organic layer 12 is formed on the support surface including the foreign substances 16 without leaving voids. Accordingly, it is possible to form the inorganic layer 14 on the surface of the organic layer 12 without leaving voids with etching and the like of the foreign substances 16 caused by plasma during the formation of the inorganic layer 14 being greatly suppressed.

The support Bo on which the inorganic layer 14 has been formed by the film formation means 82 while being supported/transported by the drum 80, that is, the gas barrier film 10, is guided to follow the predetermined route by the guide roller 86, and transported to the roll-up chamber 60 through a slit 75a formed in a partition 75.

In the illustrated example, the roll-up chamber 60 includes a guide roller 90, a roll-up shaft 92, and the aforesaid vacuum exhaust means 76.

The gas barrier film 10 having been transported to the roll-up chamber 60 is rolled up by the roll-up shaft 92 to form a roll shape, and a roll FR thus obtained by rolling up the gas barrier film 10 is supplied to the next step.

In the gas barrier film 10 fabricated as above, the general support B of which the surface has 10 or more foreign substances 16 per 1 $cm^2$ is used. Moreover, even though the surface of the organic layer 12 has irregularities resulting from the foreign substances 16 and the organic layer 12 does not have a thickness greater than necessary, the organic layer 12 covers the surface of the support B including the foreign substances 16 without leaving voids. Consequently, in the gas barrier film 10, the inorganic layer 14 is formed without leaving voids (with an extremely small number of voids in the inorganic layer 14). As a result, according to the present invention, the high-performance gas barrier film 10 such as a gas barrier film exhibiting a high degree of gas barrier properties with a moisture vapor transmission rate of less than $1 \times 10^{-3}$ [g/($m^2$·day)] can be obtained.

Moreover, according to the present invention, the general support B whose surface is not cleaned to a high degree is used. The support B does not need to be cleaned to a high degree, and storage of the support B and formation of the organic layer 12 can be carried out in a normal atmosphere. Therefore, such a high-performance gas barrier film 10 can be obtained at low cost with high productivity. Furthermore, since the organic layer 12 is not unnecessarily thick, it is possible to realize the cost reduction or the improvement of productivity owing to the decrease in the amount of coating material used, the improvement of productivity owing to shortening of the time taken for curing, and the like.

In addition, since the organic layer 12 on the support surface is not unnecessarily thick, it is possible to prevent cracking of the organic layer 12 and the deterioration of function resulting from the cracking and to prevent flexibility deterioration, curling, and the like of the functional film that are caused by an unnecessarily-thick organic layer 12.

For fabricating the functional film 26 having the protective organic layer 24 as the uppermost layer as shown in FIG. 1B, the roll FR may be loaded again on the organic film forming apparatus 30 to form the protective organic layer 24 by a known method.

Moreover, for preparing a functional film having one or more combinations of the middle organic layer 12m and the middle inorganic layer 14m as shown in FIG. 1C, rolls required for forming films may be sequentially loaded onto the organic film forming apparatus 30 and the inorganic film forming apparatus 32, according to the number of the combinations of the middle organic layer 12m and the middle inorganic layer 14m to be formed (according to the repeating number of organic layer/inorganic layer), the middle organic layer 12m and the middle inorganic layer 14m may be formed by a known method to form a predetermined number of layers, and finally, the protective organic layer 24 may be optionally formed by the organic film forming apparatus 30.

The functional film manufacturing method and the functional film of the present invention have been described in detail, but the present invention is not limited to the above examples, and may be improved or modified in various ways within a range that does not depart from the gist of the present invention.

EXAMPLES

Hereinafter, the present invention will be described in more detail based on specific examples of the present invention.

Example 1

As the functional film, gas barrier films 10 each having an organic layer 12 and an inorganic layer 14 on a surface of a support B as shown in FIG. 1A were prepared.

As the support B, a long polyethylene terephthalate (PET) film having a width of 1,000 mm and a thickness of 100 μm was used.

As a result of observing the support B by a scanning electron microscope (SEM), it was found that 10 or more foreign substances 16 having a height of 3 μm or more adhered on the surface of the support B per 1 $cm^2$.

Meanwhile, a coating material was prepared so as to form organic layers 12 having different thicknesses with different amounts of the coating material.

As the thickness of the organic layer 12, six thicknesses of 0.03 μm (Comparative Example), 0.05 μm (Inventive Example), 0.5 μm (Inventive Example), 1 μm (Inventive Example), 3 μm (Inventive Example), and 5 μm (Comparative Example) were set.

As the amount of the coating material used for coating, six amounts of 1 $cc/m^2$ (Comparative Example), 3 $cc/m^2$ (Comparative Example), 5 $cc/m^2$ (Inventive Example), 10 $cc/m^2$ (Inventive Example), 20 $cc/m^2$ (Inventive Example), and 30 $cc/m^2$ (Inventive Example) were set.

As the organic compound, TMPTA (manufactured by Daicel-Cytec Company, Ltd.) was used. As an organic solvent, MEK was used. A photopolymerization initiator (Irg184 manufactured by Ciba Chemicals Corporation) in a concentration of 2% by weight and a surfactant (BYK378 manufactured by BYK Japan KK) in a concentration of 1% by weight were added to the coating material, where the concentration was defined excluding the organic solvent (that is, the organic compound was in a concentration of, excluding the organic solvent, 97% by weight).

The relationship among the film thickness of the organic layer 12, the amount of the coating material used for coating, and the solid content concentration of the coating material is shown in the following Table 1-1.

TABLE 1-1

| | | (Amount of solid contents in coating material [%]) | | | | | |
|---|---|---|---|---|---|---|---|
| | | Amount of coating material used for coating [cc/m2] | | | | | |
| | | 1 (Comparative Example) | 3 (Comparative Example) | 5 (Inventive Example) | 10 (Inventive Example) | 20 (Inventive Example) | 30 (Inventive Example) |
| Film thickness [μm] | 0.03 (Comparative Example) | 3 | 1 | 0.6 | 0.3 | 0.15 | 0.1 |
| | 0.05 (Inventive Example) | 5 | 1.7 | 1 | 0.5 | 0.25 | 0.17 |
| | 0.5 (Inventive Example) | 50 | 17 | 10 | 5 | 2.5 | 1.7 |
| | 1 (Inventive Example) | — | 33 | 20 | 10 | 5 | 3.3 |
| | 3 (Inventive Example) | — | — | 60 | 30 | 15 | 5 |
| | 5 (Comparative Example) | — | — | — | 50 | 25 | 17 |

A support roll BR obtained by rolling up the support B was loaded on the rotary shaft 42 of the organic film forming apparatus 30 shown in FIG. 2A, and the surface of the support B was coated with the prepared coating material and dried, followed by UV irradiation for crosslinking and curing, thereby forming a support roll BoR obtained by rolling up the support B on which the organic layer 12 was formed.

A die coater was used as the coating means 36, and coating was controlled to establish the set amount of the coating material used for coating according to the combination of the coating material to be used and the set film thickness.

Hot air was used as the drying means 38, and the temperature of hot air was controlled according to the amount of the coating material used for coating and the solid content concentration of the coating material such that drying was appropriately performed.

Moreover, an UV irradiation apparatus was used as the light irradiation means 40, and the amount of light was controlled according to the set film thickness such that the organic layer 12 was appropriately cured.

In the drying means 38, sampling was performed to measure the viscosity and surface tension of the coating material in the decreasing-rate-of-drying state. As a result, in all examples, the viscosity was confirmed to be 90 cP or higher and the surface tension was confirmed to be 29 mN/m or less. The viscosity was measured by an SV-type viscometer. The surface tension was measured by a surface tensiometer (DY300 manufactured by Kyowa Interface Science Co., LTD.).

Moreover, the Tg of the formed organic layer 12 was measured. As a result, in all examples, the Tg was confirmed to be 250° C. or higher. The Tg was measured by a dynamic viscoelasticity measuring apparatus (DMA).

Further, the difference in height of the surface of the formed organic layer 12 was measured. As a result, in all examples, the difference in height of the surface per 1 cm$^2$ of the organic layer 12 was confirmed to be 300 nm or more. The difference of height of the surface was measured by an AFM by using 100 sheets of 100 μm square.

Subsequently, the support roll BoR was loaded on the inorganic film forming apparatus 32 shown in FIG. 2B, and a silicon nitride film having a film thickness of 50 nm was formed by CCP-CVD as the inorganic layer 14 on the surface of the support Bo on which the organic layer 12 had been formed so as to form a roll FR obtained by rolling up the gas barrier film 10 on which the inorganic layer 14 had been formed.

The film formation means 82 was constituted with a shower electrode disposed so as to face the drum 80, a high-frequency power source supplying plasma excitation power to the shower electrode, a bias supply supplying bias power to the drum 80, and supply means configured to supply raw material gas to the shower electrode. The drum 80 made of stainless steel was used to act as a counter electrode of the shower electrode.

As deposition gas, silane gas ($SiH_4$), ammonia gas ($NH_3$), nitrogen gas ($N_2$), and hydrogen gas ($H_2$) were used. The silane gas was supplied in an amount of 100 sccm, the ammonia gas was supplied in an amount of 200 sccm, the nitrogen gas was supplied in an amount of 500 sccm, and the hydrogen gas was supplied in an amount of 500 sccm. The film was formed under a pressure of 50 Pa.

Plasma excitation power of 3,000 W was supplied to the film-forming shower electrode from the high-frequency power source at a frequency of 13.5 MHz. Furthermore, bias power of 500 W was supplied to the drum 80 from the bias supply. During the film formation, the temperature of the drum 80 was adjusted to −20° C.

The moisture vapor transmission rate (barrier properties) [g/(m$^2$·day)] of the fabricated gas barrier films was measured by a calcium corrosion test (a method disclosed in JP 2005-283561 A).

When the moisture vapor transmission rate was less than $1.0 \times 10^{-4}$ [g/(m$^2$·day)], it was evaluated to be excellent;

when the moisture vapor transmission rate was $1.0 \times 10^{-4}$ [g/(m$^2$·day)] or higher and less than $2.0 \times 10^{-4}$ [g/(m$^2$·day)], it was evaluated to be good;

when the moisture vapor transmission rate was $2.0 \times 10^4$ [g/(m$^2$·day)] or higher and less than $1.0 \times 10^{-3}$ [g/(m$^2$·day)], it was evaluated to be fair; and when the moisture vapor transmission rate was $1.0 \times 10^3$ [g/(m$^2$·day)] or higher, it was evaluated to be poor.

The above results are shown in the following Tables 1-2 and 1-3.

TABLE 1-2

| | | \multicolumn{6}{c}{(Barrier properties [g/ (m2 · day)])} | | | | | |
|---|---|---|---|---|---|---|---|
| | | \multicolumn{6}{c}{Amount of coating material used for coating[cc/m2]} | | | | | |
| | | 1 (Comparative Example) | 3 (Comparative Example) | 5 (Inventive Example) | 10 (Inventive Example) | 20 (Inventive Example) | 30 (Inventive Example) |
| Film thickness [μm] | 0.03 (Comparative Example) | $8 \times 10^{-3}$ | $5.5 \times 10^{-3}$ | $4.3 \times 10^{-3}$ | $3.3 \times 10^{-4}$ | $2.9 \times 10^{-3}$ | $2.8 \times 10^{-3}$ |
| | 0.05 (Inventive Example) | $7 \times 10^{-3}$ | $5.1 \times 10^{-3}$ | $8 \times 10^{-4}$ | $1.8 \times 10^{-4}$ | $1.5 \times 10^{-4}$ | $1.2 \times 10^{-4}$ |
| | 0.5 (Inventive Example) | $6.8 \times 10^{-3}$ | $4.8 \times 10^{-3}$ | $7 \times 10^{-4}$ | $1.6 \times 10^{-4}$ | $1.2 \times 10^{-4}$ | $1.1 \times 10^{-4}$ |
| | 1 (Inventive Example) | — | $4.2 \times 10^{-3}$ | $5.6 \times 10^{-4}$ | $1.2 \times 10^{-4}$ | $9 \times 10^{-5}$ | $9.3 \times 10^{-5}$ |
| | 3 (Inventive Example) | — | — | $3.8 \times 10^{-4}$ | $1 \times 10^{-4}$ | $8.4 \times 10^{-5}$ | $8.1 \times 10^{-5}$ |
| | 5 (Comparative Example) | — | — | — | $3 \times 10^{-3}$ | $3.2 \times 10^{-3}$ | $3.4 \times 10^{-3}$ |

TABLE 1-3

| | | Amount of coating material used for coating[cc/m$^2$] | | | | | |
|---|---|---|---|---|---|---|---|
| | | 1 (Comparative Example) | 3 (Comparative Example) | 5 (Inventive Example) | 10 (Inventive Example) | 20 (Inventive Example) | 30 (Inventive Example) |
| Film thickness [μm] | 0.03 (Comparative Example) | Poor | Poor | Poor | Poor | Poor | Poor |
| | 0.05 (Inventive Example) | Poor | Poor | Fair | Good | Good | Good |
| | 0.5 (Inventive Example) | Poor | Poor | Fair | Good | Good | Good |
| | 1 (Inventive Example) | — | Poor | Fair | Good | Excellent | Excellent |
| | 3 (Inventive Example) | — | — | Fair | Good | Excellent | Excellent |
| | 5 (Comparative Example) | — | — | — | Poor | Poor | Poor |

The present invention satisfies both the film thickness of the organic layer 12 of 0.05 μm to 3 μm and the amount of the coating material used for coating of 5 cc/m$^2$ or more. That is, Inventive Examples of the present invention correspond to the area surrounded by the thick frame in the tables.

As shown in the above tables, all of the gas barrier films according to the present invention were evaluated to be at the level of Fair or a higher level, and exhibited excellent gas barrier properties with a moisture vapor transmission rate of less than $1.0 \times 10^{-3}$ [g/(m$^2$·day)].

In contrast, in examples in which the film thickness of the organic layer was less than 0.05 μm, probably, the organic layer 12 was unable to appropriately cover the surfaces of the foreign substances 16; at these portions, etching or the like of the foreign substances 16 was caused by plasma during the formation of the inorganic layer 14 and this prevented the inorganic layer 14 from being appropriately formed; and consequentially, sufficient gas barrier properties were not achieved. Moreover, in examples in which the film thickness of the organic layer exceeded 3 μm, probably, after the formation of the organic layer 12, at the time of rolling up to form a roll, a defect such as cracking and the like occurred in the organic layer 12; etching of the foreign substances 16 or the support B was caused at the defect portion of the organic layer 12 during the formation of the inorganic layer 14 and this prevented the inorganic layer 14 from being appropriately formed; and consequentially, sufficient gas barrier properties were not achieved.

Furthermore, in examples in which the amount of the coating material used for coating was less than 5 cc/m$^2$, probably, the organic layer 12 was unable to appropriately cover the surfaces of the foreign substances 16; at these portions, etching or the like of the foreign substances 16 was caused by plasma during the formation of the inorganic layer 14 and this prevented the inorganic layer 14 from being appropriately formed; and consequentially, sufficient gas barrier properties were not achieved.

Example 2

As the support B, the polyethylene terephthalate (PET) film was used as in Example 1. As a result of observing the support B in the same manner as in Example 1, it was found that 10 or more foreign substances 16 having a height of 3 μm or more adhered on the surface of the support B per 1 cm$^2$.

Meanwhile, TMPTA and A-NOD-N (manufactured by Shin-Nakamura Chemical Co., Ltd.) were used as the organic compounds to prepare coating materials. As the organic solvent, MEK was used. Moreover, similarly to Example 1, a photopolymerization initiator in a content of 2% by weight and a surfactant in a content of 1% by weight were added to each coating material, where the concentration was defined excluding the organic solvent. The photopolymerization initiator and the surfactant as used were the same as those used in Example 1.

Six types of coating materials were prepared by changing the quantitative ratio of TMPTA to A-NOD-N (expressed in % by weight, where the concentration was defined excluding the organic solvent), as TMPTA/A-NOD-N=97/0, TMPTA/A-NOD-N=92/5, TMPTA/A-NOD-N=82/15, TMPTA/A-NOD-N=62/35, TMPTA/A-NOD-N=52/45, and TMPTA/A-NOD-N=42/55.

The solid content concentration of each of the coating materials was set to 5% by weight. Accordingly, when the coating material used for coating was set to 10 cc/m$^2$, the film thickness of the organic layer 12 was 0.5 μm.

By using the coating materials prepared as above, the organic layer 12 and the inorganic layer 14 were formed on the support B in the same manner as in Example 1, thereby preparing six kinds of gas barrier films 10.

In the organic film forming apparatus 30, the amount of the coating material used for coating in the coating means 36 was set to 10 cc/m$^2$. That is, the film thickness of the organic layer 12 in the present example was 0.5 μm.

Further, in the organic film forming apparatus 30, the drying means 38 and the light irradiation means 40 were treated as fixed conditions in which films were dried and cured appropriately according to the solid content concentration of the coating material and the amount of the coating material used for coating.

The viscosity and surface tension of the coating film in the decreasing-rate-of-drying state were measured in the same manner as in Example 1. As a result, in all examples, the viscosity was confirmed to be 90 cP or higher, and the surface tension was confirmed to be 29 mN/m or less.

Moreover, the Tg of the organic layer 12 was measured in the same manner as in Example 1. As a result, the organic layer in which the ratio of TMPTA/A-NOD-N was 97/0 was confirmed to have a Tg of 250° C. or higher (Inventive Example 2-1), the organic layer in which the ratio was 92/5 was confirmed to have a Tg of 250° C. (Inventive Example 2-2), the organic layer in which the ratio was 82/15 was confirmed to have a Tg of 200° C. (Inventive Example 2-3), the organic layer in which the ratio was 62/35 was confirmed to have a Tg of 120° C. (Inventive Example 2-4), the organic layer in which the ratio was 52/45 was confirmed to have a Tg of 100° C. (Inventive Example 2-5), and the organic layer in which the ratio was 42/55 was confirmed to have a Tg of 75° C. (Comparative Example 2-1).

Furthermore, the difference in height of the surface of the organic layers 12 formed in the same manner as in Example 1 was measured. As a result, in all of the organic layers 12, the difference in height of the surface per 1 cm$^2$ was confirmed to be 300 nm or more.

The moisture vapor transmission rate [g/(m$^2$·day)] of the fabricated gas barrier films was measured and evaluated in the same manner as in Example 1.

The results are shown in the following table.

TABLE 3

| | Main monomer | Compounding ratio of monomers | Tg [° C.] | Barrier properties [g/m$^2$ · day] | Evaluation |
|---|---|---|---|---|---|
| Inventive Example 2-1 | TMPTA | 97 0 | 250 or higher | $1.2 \times 10^{-4}$ | Good |
| Inventive Example 2-2 | TMPTA/ A-NOD-N | 92 5 | 250 | $1.5 \times 10^{-4}$ | Good |
| Inventive Example 2-3 | TMPTA/ A-NOD-N | 82 15 | 200 | $1.8 \times 10^{-4}$ | Good |
| Inventive Example 2-4 | TMPTA/ A-NOD-N | 62 35 | 120 | $1.9 \times 10^{-4}$ | Good |
| Inventive Example 2-5 | TMPTA/ A-NOD-N | 52 45 | 100 | $3.5 \times 10^{-4}$ | Fair |
| Comparative Example 2-1 | TMPTA/ A-NOD-N | 42 55 | 75 | $8.9 \times 10^{-3}$ | Poor |

As shown in the above table, all of the gas barrier films of the present invention having the organic layers 12 with a Tg of 100° C. or higher exhibited excellent gas barrier properties with a moisture vapor transmission rate of less than $1.0 \times 10^3$ [g/(m$^2$·day)].

In contrast, in the gas barrier film of Comparative Example 2-1 having the organic layer 12 with a Tg lower than 100° C., probably, since the organic layer 12 was etched by plasma during the formation of the inorganic layer 14 and this prevented the inorganic layer 14 from being formed, sufficient gas barrier properties were not achieved.

Example 3

As the support B, the polyethylene terephthalate (PET) film was used as in Example 1. As a result of observing the support B in the same manner as in Example 1, it was found that 10 or more foreign substances 16 having a height of 3 µm or more adhered on the surface of the support B per 1 cm$^2$.

Meanwhile, as the coating material that is to be the organic layer 12, MEK was used as the organic solvent, and a coating material containing TMPTA in a content of 97% by weight, a photopolymerization initiator in a content of 2% by weight, and a surfactant in a content of 1% by weight was prepared (in the same manner as in Inventive Example 2-1), where the concentration was defined excluding the organic solvent. The photopolymerization initiator and the surfactant as used were the same as those used in Example 1.

The solid content concentration of the coating material was set to 5% by weight as in Example 2. Accordingly, when the coating material used for coating was set to 10 cc/m$^2$, the film thickness of the organic layer 12 was 0.5 µm.

By using the coating material prepared as above, the organic layer 12 and the inorganic layer 14 were formed on the support B in the same manner as in Example 2, except that the drying temperature in the drying means 38 was changed to 30° C., 80° C., 120° C., and 140° C., thereby preparing four kinds of gas barrier films 10 dried at the respective drying temperatures.

The viscosity and surface tension of the coating film in the decreasing-rate-of-drying state were measured in the same manner as in Example 1.

As a result, in all examples, the surface tension was confirmed to be 29 mN/m or less.

On the other hand, the viscosity of the coating film dried at 30° C. was 80 cP (Example 3-1), the viscosity of the coating film dried at 80° C. was 50 cP (Example 3-2), the viscosity of the coating film dried at 120° C. was 20 cP (Example 3-3), and the viscosity of the coating film dried at 140° C. was 10 cP (Comparative Example 3-1).

Moreover, the Tg of the organic layer 12 formed in the same manner as in Example 1 was measured. As a result, the Tg of all of the organic layers 12 was confirmed to be 250° C. or higher.

Furthermore, the difference in height of the surface of the organic layer 12 formed in the same manner as in Example 1 was measured. As a result, in all of the organic layers 12, the difference in height of the surface per 1 cm$^2$ was confirmed to be 300 nm or more.

The moisture vapor transmission rate [g/(m$^2$·day)] of the fabricated gas barrier films was measured and evaluated in the same manner as in Example 1.

The results are shown in the following table.

TABLE 4

| | Drying temperature [° C.] | Viscosity [cP] | Barrier properties [g/m$^2$ · day] | Evaluation |
|---|---|---|---|---|
| Inventive Example 3-1 | 30 | 80 | $1.2 \times 10^{-4}$ | Good |
| Inventive Example 3-2 | 80 | 50 | $1.4 \times 10^{-4}$ | Good |
| Inventive Example 3-3 | 120 | 20 | $3.4 \times 10^{-4}$ | Fair |
| Comparative Example 3-1 | 140 | 10 | $9.4 \times 10^{-3}$ | Poor |

As shown in the above table, all of the gas barrier films of the present invention having the coating films with a viscosity of 20 cP or higher in the decreasing-rate-of-drying state exhibited excellent gas barrier properties with a moisture vapor transmission rate of less than $1.0 \times 10^3$ [g/(m$^2$·day)].

In contrast, in Comparative Example 3-1 in which the coating film had a viscosity of less than 20 cp in the decreasing-rate-of-drying state, probably, the organic layer 12 was unable to appropriately cover the surfaces of the foreign substances 16; at these portions, etching or the like was caused by plasma during the formation of the inorganic layer 14 and this prevented the inorganic layer 14 from being appropriately formed; and consequentially, sufficient gas barrier properties were not achieved.

Example 4

As the support B, the polyethylene terephthalate (PET) film was used as in Example 1. As a result of observing the support B in the same manner as in Example 1, it was found that 10 or more foreign substances 16 having a height of 3 µm or more adhered on the surface of the support B per 1 cm².

Meanwhile, eight kinds of coating materials were prepared in the same manner as in Example 2, except that the amount of the added surfactant (the content defined excluding the organic solvent) was changed to 8% by weight, 7% by weight, 1% by weight, 0.5% by weight, 0.25% by weight, 0.1% by weight, 0.005% by weight, and 0% by weight, and that A-NOD-N was not used.

In each of the coating materials, the content of the organic compound (TMPTA) was adjusted according to the amount of the added surfactant such that the content of the photo-polymerization initiator became 2% by weight in all of the examples with Inventive Example 4-3 in which the content of the surfactant was 1% by weight being used as a reference.

Similarly to Example 2, the solid content concentration of each of the coating materials was set to 5% by weight. Accordingly, when the coating material used for coating was set to 10 cc/m², the film thickness of the organic layer 12 was 0.5 µm.

By using the coating materials prepared as above, the organic layer 12 and the inorganic layer 14 were formed on the support B in the same manner as in Example 2, thereby preparing eight kinds of gas barrier films 10.

The viscosity and surface tension of the coating film in the decreasing-rate-of-drying state were measured in the same manner as in Example 1. As a result, in all examples, the viscosity was confirmed to be 90 cP or higher.

On the other hand, the coating film containing the surfactant in a content of 8% by weight had a surface tension of 27 mN/m (Inventive Example 4-1), the coating film containing the surfactant in a content of 7% by weight had a surface tension of 28 mN/m (Inventive Example 4-2), the coating film containing the surfactant in a content of 1% by weight had a surface tension of 29 mN/m (Inventive Example 4-3), the coating film containing the surfactant in a content of 0.5% by weight had a surface tension of 30 mN/m (Inventive Example 4-4), the coating film containing the surfactant in a content of 0.25% by weight had a surface tension of 31 mN/m (Inventive Example 4-5), the coating film containing the surfactant in a content of 0.1% by weight had a surface tension of 32 mN/m (Inventive Example 4-6), the coating film containing the surfactant in a content of 0.005% by weight had a surface tension of 34 mN/m (Inventive Example 4-7), and the coating film (surfactant-free) containing the surfactant in a content of 0% by weight had a surface tension of 37 mN/m (Comparative Example 4-1).

Moreover, the Tg of the organic layer 12 formed in the same manner as in Example 1 was measured. As a result, all of the organic layers 12 were confirmed to have a Tg of 250° C. or higher.

Furthermore, the difference in height of the surface of the organic layer 12 formed in the same manner as in Example 1 was measured. As a result, in all of the organic layers 12, the difference in height of the surface per 1 cm² was confirmed to be 300 nm or more.

The moisture vapor transmission rate [g/(m²·day)] of each of the fabricated gas barrier films was measured and evaluated in the same manner as in Example 1.

The results are shown in the following table.

TABLE 5

| | Surfactant [%] | Surface tension [mN/m] | Barrier properties [g/m2 · day] | Evaluation |
|---|---|---|---|---|
| Inventive Example 4-1 | 8 | 27 | $2.1 \times 10^{-4}$ | Fair |
| Inventive Example 4-2 | 7 | 28 | $1.8 \times 10^{-4}$ | Good |
| Inventive Example 4-3 | 1 | 29 | $1.2 \times 10^{-4}$ | Good |
| Inventive Example 4-4 | 0.5 | 30 | $1.3 \times 10^{-4}$ | Good |
| Inventive Example 4-5 | 0.25 | 31 | $1.4 \times 10^{-4}$ | Good |
| Inventive Example 4-6 | 0.1 | 32 | $1.5 \times 10^{-4}$ | Good |
| Inventive Example 4-7 | 0.005 | 34 | $2.1 \times 10^{-4}$ | Fair |
| Comparative Example 4-1 | 0 | 37 | $1.1 \times 10^{-3}$ | Poor |

As shown in the above table, all of the gas barrier films according to the present invention having the coating films with a surface tension of 34 mN/m or less in the decreasing-rate-of-drying state exhibited excellent gas barrier properties with a moisture vapor transmission rate of less than $1.0 \times 10^3$ [g/(m²·day)].

In contrast, in Comparative Example 4-2 in which the surface tension of the coating film in the decreasing-rate-of-drying state exceeded 34 mN/m, probably, the organic layer 12 was unable to appropriately cover the surfaces of the foreign substances 16; at these portions, etching or the like was caused by plasma during the formation of the inorganic layer 14, and this prevented the inorganic layer 14 from being appropriately formed; and consequentially, sufficient gas barrier properties were not achieved.

The above results clearly show the effects of the present invention.

The present invention can be suitably used for a gas barrier film used in solar cells, organic EL displays, and the like, and for manufacturing of the gas barrier film.

What is claimed is:

1. A functional film manufacturing method, in manufacturing a functional film having an organic layer on a support and an inorganic layer on the organic layer, comprising the steps of:
    preparing a coating material containing an organic compound which has a glass transition temperature of 100° C. or higher and is to be the organic layer, and an organic solvent;
    coating a surface of the support with the coating material in an amount of 5 cc/m² or more such that a thickness of the organic layer becomes 0.05 to 3 µm;
    forming the organic layer by drying the coating material coated on the surface of the support such that the coating material has a viscosity of 20 cP or higher and a surface tension of 34 mN/m or less in a decreasing-rate-of-drying state, and then curing the organic compound; and
    forming the inorganic layer on a surface of the formed organic layer by a vapor phase deposition method accompanied by generation of plasma,
    wherein a surface of the organic layer is a surface having irregularities due to foreign substances present on the surface of the support.

2. The functional film manufacturing method according to claim 1, wherein the coating material contains a surfactant in a concentration of, excluding the organic solvent, 0.005 to 7% by weight.

3. The functional film manufacturing method according to claim 1, wherein the support is coated with the coating material by a die coating method.

4. The functional film manufacturing method according to claim 1, wherein the viscosity of the coating material to be coated on the support is 0.8 to 10 cP.

5. The functional film manufacturing method according to claim 1, wherein the inorganic layer is formed by the vapor phase deposition method accompanied by generation of plasma while the support on which the organic layer has been formed is transported in a predetermined direction.

6. The functional film manufacturing method according to claim 5, wherein the support is drawn from a support roll obtained by rolling up the support having a long length to form a roll shape, the organic layer is formed by coating the support with the coating material, drying the coating material and curing the organic compound while the drawn support is transported in a longitudinal direction, and the support on which the organic layer has been formed is rolled up again to form a roll shape to obtain a support/organic layer roll; and the support on which the organic layer has been formed is drawn from the support/organic layer roll, the inorganic layer is formed while the support is transported in the longitudinal direction, and the support on which the inorganic layer has been formed is rolled up again to form a roll shape.

7. The functional film manufacturing method according to claim 1, wherein the organic compound contained in the coating material is a (meth)acrylate-based organic compound which is crosslinked by photopolymerization reaction.

8. The functional film manufacturing method according to claim 1, wherein the inorganic layer is formed of one of silicon nitride, silicon oxide, silicon oxynitride, and aluminum oxide.

9. The functional film manufacturing method according to claim 1, wherein a difference in height of the surface of the organic layer per 1 $cm^2$ is 300 nm or more.

10. The functional film manufacturing method according to claim 1, wherein a difference in height of the surface of the organic layer per 1 $cm^2$ is 500 nm or more.

11. The functional film manufacturing method according to claim 1, wherein the organic layer contains an organic compound having the glass transition temperature of 120° C. or higher as a main component.

12. The functional film manufacturing method according to claim 1, wherein the organic layer contains an organic compound having the glass transition temperature of 150° C. or higher as a main component.

13. The functional film manufacturing method according to claim 1, wherein the amount of the coating material used for coating is 7 $cc/m^2$ or more.

14. The functional film manufacturing method according to claim 1, wherein the viscosity of the coating material in the decreasing-rate-of-drying state is 50 cP or higher.

15. The functional film manufacturing method according to claim 1, wherein the viscosity of the coating material in the decreasing-rate-of-drying state is 100 cP or higher.

16. The functional film manufacturing method according to claim 1, wherein the viscosity of the coating material in the decreasing-rate-of-drying state is 10,000 cP or less.

17. The functional film manufacturing method according to claim 1, wherein the surface tension of the coating material in the decreasing-rate-of-drying state is 30 mN/m or less.

18. The functional film manufacturing method according to claim 1, wherein the surface tension of the coating material in the decreasing-rate-of-drying state is 28 mN/m or less.

19. The functional film manufacturing method according to claim 1, wherein the surface tension of the coating material in the decreasing-rate-of-drying state is 23 mN/m or higher.

* * * * *